(12) United States Patent
Dreesen

(10) Patent No.: US 9,792,979 B1
(45) Date of Patent: Oct. 17, 2017

(54) PROCESS, VOLTAGE, AND TEMPERATURE TRACKING SRAM RETENTION VOLTAGE REGULATOR

(71) Applicant: Apple Inc., Cupertino, CA (US)

(72) Inventor: Michael A. Dreesen, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/365,462

(22) Filed: Nov. 30, 2016

(51) Int. Cl.
  G11C 7/12 (2006.01)
  G11C 11/417 (2006.01)
  G11C 11/412 (2006.01)
  G11C 5/14 (2006.01)

(52) U.S. Cl.
  CPC ............ G11C 11/417 (2013.01); G11C 5/147 (2013.01); G11C 7/12 (2013.01); G11C 11/412 (2013.01)

(58) Field of Classification Search
  CPC .................................. G11C 7/12; G11C 16/10
  USPC ............................................... 365/156, 185.24
  See application file for complete search history.

(56) References Cited

U.S. PATENT DOCUMENTS

| | | | | |
|---|---|---|---|---|
| 4,651,302 A | * | 3/1987 | Kimmel | G11C 17/08 327/51 |
| 5,563,546 A | * | 10/1996 | Tsukada | G11C 5/147 327/407 |
| 5,581,209 A | * | 12/1996 | McClure | G05F 3/262 327/530 |
| 5,694,090 A | * | 12/1997 | Morgan | H03K 3/3545 331/111 |
| 5,999,460 A | * | 12/1999 | Oh | G11C 5/147 365/189.09 |
| 6,097,179 A | * | 8/2000 | Ray | G05F 3/245 323/273 |
| 7,990,780 B2 | | 8/2011 | Tam et al. | |
| 8,068,376 B1 | * | 11/2011 | Tran | G11C 5/147 365/222 |
| 8,885,393 B2 | | 11/2014 | Bhatia et al. | |
| 9,189,052 B2 | | 11/2015 | Bhatia et al. | |
| 9,411,406 B2 | | 8/2016 | Tang et al. | |
| 2002/0097627 A1 | * | 7/2002 | Sacco | G11C 5/147 365/226 |

(Continued)

OTHER PUBLICATIONS

Sokolov, Dotan, U.S. Appl. No. 60/991,246, entitled "Method to adjust reading thresholds", filed Nov. 30, 2007, 3 pages.

*Primary Examiner* — Michael Tran
(74) *Attorney, Agent, or Firm* — Rory D. Rankin; Meyertons, Hood, Kivlin, Kowert & Goetzel, P.C.

(57) ABSTRACT

Systems, apparatuses, and methods for tracking a retention voltage are disclosed. In one embodiment, a circuit is utilized for generating a standby voltage for a static random-access memory (SRAM) array. The circuit tracks the leakage current of the bitcells of the SRAM array as the leakage current varies over temperature. The circuit mirrors this leakage current and tracks the higher threshold voltage of a p-channel transistor or an n-channel transistor, with the p-channel and n-channel transistors matching the transistors in the bitcells of the SRAM array. The circuit includes a voltage regulator to supply power to the SRAM array at a supply voltage proportional to the higher threshold voltage tracked. Setting a supply voltage of the SRAM array based on threshold voltages and leakage current may reduce power consumption as compared to using a supply voltage based on a worst case operating conditions assumption for the SRAM array.

19 Claims, 21 Drawing Sheets

(56) References Cited

U.S. PATENT DOCUMENTS

| | | | |
|---|---|---|---|
| 2003/0043677 A1* | 3/2003 | Marr | G11C 11/417 365/226 |
| 2006/0206739 A1* | 9/2006 | Kim | G11C 11/412 713/322 |
| 2007/0016808 A1* | 1/2007 | Bhunia | H03K 19/0016 713/300 |
| 2007/0250797 A1* | 10/2007 | Engel | G06F 17/5036 716/113 |
| 2010/0208529 A1* | 8/2010 | Kenkare | G11C 11/413 365/189.09 |
| 2011/0211383 A1* | 9/2011 | Russell | G11C 7/02 365/148 |
| 2012/0212194 A1* | 8/2012 | Tachibana | G05F 3/30 323/268 |
| 2012/0230126 A1* | 9/2012 | Ramaraju | G11C 5/147 365/189.06 |
| 2013/0106394 A1* | 5/2013 | Kobayashi | G05F 3/242 323/314 |
| 2013/0107651 A1* | 5/2013 | Singh | G11C 11/412 365/207 |
| 2013/0135955 A1 | 5/2013 | McCombs et al. | |
| 2014/0177349 A1* | 6/2014 | Dreesen | G11C 11/417 365/189.05 |
| 2015/0235711 A1* | 8/2015 | Zhou | G11C 16/28 365/185.21 |
| 2016/0118939 A1* | 4/2016 | Kong | H03F 3/3022 330/296 |
| 2016/0197082 A1* | 7/2016 | Park | H01L 27/10826 257/296 |
| 2017/0017253 A1* | 1/2017 | Onishi | G05F 3/262 |

* cited by examiner

| Temperature | Optimal Diode |
|---|---|
| Temp < -30 C | Diode 210A |
| -30 C ≤ Temp < -20 C | Diode 210B |
| -20 C ≤ Temp < -10 C | Diode 210C |
| -10 C ≤ Temp < 0 C | Diode 210D |
| 0 C ≤ Temp < 10 C | Diode 210E |
| 10 C ≤ Temp < 20 C | Diode 210F |
| 20 C ≤ Temp < 30 C | Diode 210G |
| 30 C ≤ Temp | Diode 210H |

PROCESS, VOLTAGE, AND TEMPERATURE TRACKING SRAM RETENTION VOLTAGE REGULATOR

BACKGROUND

Technical Field

Embodiments described herein relate to the field of integrated circuits and more particularly, to tracking process, voltage, and temperature variations when generating a supply voltage for a static random-access memory (SRAM) in retention mode.

Description of the Related Art

In power-efficient silicon memories, it is desirable to power a static random-access memory (SRAM) at the lowest voltage possible to minimize standby power. The SRAM bitcell is a bi-stable circuit made up of cross-coupled CMOS inverters. For an SRAM, the retention voltage defines the minimum supply voltage under which data in the SRAM is still preserved. When portions of the SRAM are not being accessed, these portions may be placed in retention mode to conserve power. In retention mode, if the voltage supplied to the SRAM cells falls below the retention voltage, the SRAM cells will fail (i.e., data stored in the SRAM cells will be lost). Therefore, it is important to provide a supply voltage which stays above the retention voltage. Unfortunately, the retention voltage is a difficult voltage to track as it varies with temperature and process. For example, as temperature decreases, the retention voltage increases. However, overcompensating and providing a supply voltage for a worst case scenario results in increased power consumption.

SUMMARY

Systems, apparatuses, and methods for implementing a process, voltage, and temperature tracking SRAM retention voltage regulator are contemplated.

In one embodiment, a circuit is utilized for generating a supply voltage to be supplied to a static random-access memory (SRAM) array in retention mode. A first portion of the circuit tracks the leakage current of the bitcells of the SRAM array as the leakage current varies over temperature. A second portion of the circuit mirrors this leakage current and tracks the higher threshold voltage of a p-channel transistor or an n-channel transistor, with the p-channel and n-channel transistors matching the transistors in the bitcells of the SRAM array. A third portion of the circuit is a voltage regulator which supplies power to the SRAM array at a supply voltage proportional to the threshold voltage tracked by the second portion of the circuit. Setting a supply voltage of the SRAM array based on threshold voltages and leakage current may reduce power consumption as compared to using a supply voltage based on a worst case operating conditions assumption for the SRAM array.

These and other features and advantages will become apparent to those of ordinary skill in the art in view of the following detailed descriptions of the approaches presented herein.

BRIEF DESCRIPTION OF THE DRAWINGS

The above and further advantages of the methods and mechanisms may be better understood by referring to the following description in conjunction with the accompanying drawings, in which:

FIG. 4 illustrates one embodiment of a lookup table for selecting a diode for generating an optimal supply voltage.

DETAILED DESCRIPTION OF EMBODIMENTS

Figure 1:
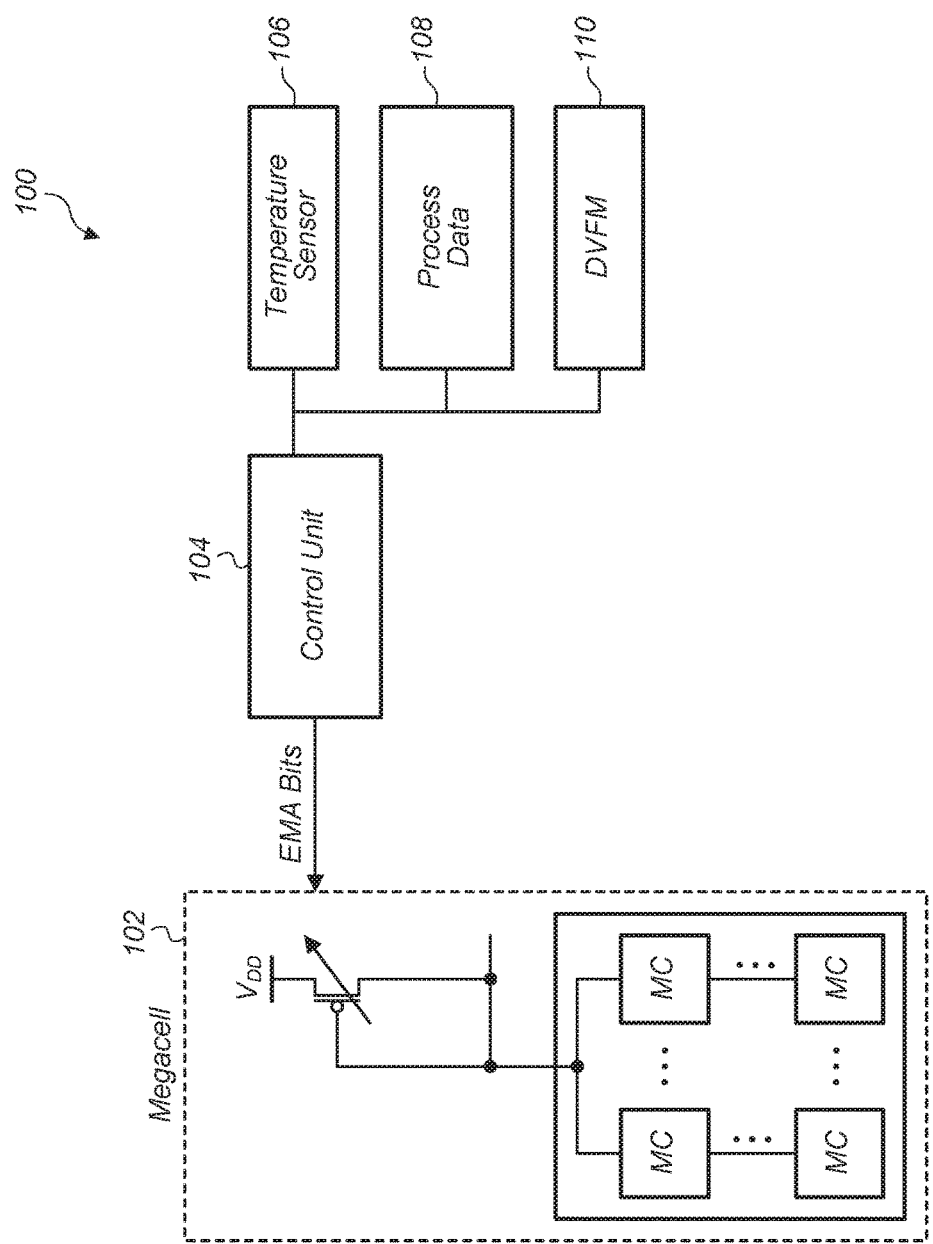
FIG. 1 is a block diagram illustrating one embodiment of an adaptive memory system.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

This specification includes references to "one embodiment". The appearance of the phrase "in one embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A system comprising a voltage regulator . . . " Such a claim does not foreclose the system from including additional components (e.g., a processor, a memory controller).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f) for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Referring now to FIG. 1, a block diagram of one embodiment of an adaptive memory system 100 is shown. System 100 includes memory megacell 102. Megacell 102 includes any number of static random-access memory (SRAM) cells which are powered by an adjustable supply voltage. In one embodiment, the adjustable supply voltage is controlled by the extra margin adjustment (EMA) bits generated by control unit 104. Accordingly, the output of control unit 104 may control and adjust the voltage level of the power supplied to any number of memory cells. While discussion in this disclosure is directed to SRAM memory cells, embodiments described herein may be applicable to other types of memory cells.

In one embodiment, control unit 104 includes a lookup table for determining how to adjust the voltage level supplied to megacell 102 based on the inputs from temperature sensor 106, process data 108, and dynamic voltage frequency management (DVFM) unit 110. Temperature sensor 106 provides temperature readings for the on-chip temperature associated with megacell 102. Process data 108 provides an indication of the process variability used to fabricate the system 100. DVFM unit 110 provides an indication of the current voltage and/or frequency settings of the power supply used for powering megacell 102 and/or other circuitry. It is noted that system 100 may also be referred to as a system on chip (SoC) or integrated circuit (IC).

Figure 2:
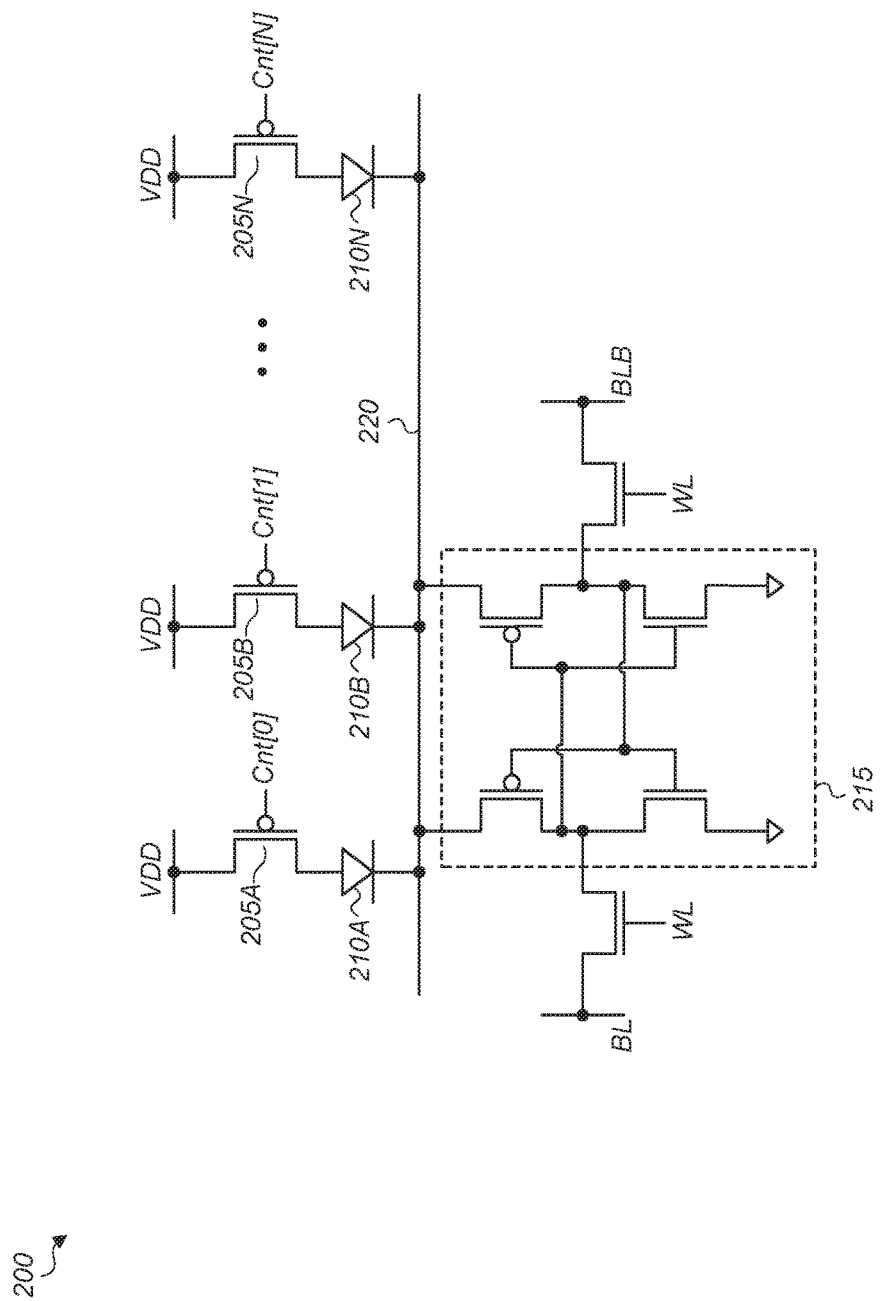
FIG. 2 is a diagram of one embodiment of an adaptive diode sizing circuit.

Turning now to FIG. 2, a diagram of one embodiment of an adaptive diode sizing circuit 200 is shown. Circuit 200 includes memory cell 215, and circuit 200 is configured to select one of diodes 210A-N to provide the optimal supply voltage for memory cell 215 when memory cell 215 is in retention mode. The outputs of diodes 210A-N are coupled together at connection 220, with connection 220 providing power at an adjustable supply voltage to memory cell 215. Diodes 210A-N are representative of any number and type of diodes which may be located in parallel between the supply voltage and connection 220. It is noted that any number of memory cells can be coupled to the supply voltage provided by the connection 220. It is noted that the term "coupled" as used herein is defined as electrically connected.

Diodes 205A-N include multiple diodes of different or same sizes. The voltage drop across the different diodes 205A-N may vary according to the size of the diode. By having multiple different sizes of diodes 205A-N in parallel between the supply voltage and connection 220, a control unit (not shown) is able to select the diode which will provide a voltage closest to the data retention voltage of memory cell 215 while also being greater than the data retention voltage. This will allow circuit 200 to reduce the amount of leakage power lost by memory cell 215.

Control signals 0-N (Cnt[0-N]) are coupled to transistors 205A-N, respectively. Transistors 205A-N are representative of any type of transistors. In one embodiment, transistors 205A-N are p-channel transistors. In other embodiments, transistors 205A-N may be other types of transistors. In one embodiment, the control signals 0-N are active low signals. A control unit is configured to select one of diodes 205A-N for coupling the supply voltage to memory bitcell 215 based on one or more of a temperature sensor, process variations during fabrication, voltage/frequency settings, and/or other factors. In one embodiment, the control unit selects the diode from diodes 205A-N which will provide a supply voltage to memory bitcell 215 which is nearest to the data retention voltage while also being greater than the data retention voltage. The control unit is configured to generate control signals 0-N to route the supply current through the chosen path which includes the selected diode.

In one embodiment, the control unit is configured to drive one of the control signals low to select the chosen diode 210A-N. The other control signals are driven high to prevent current from flowing through the corresponding transistors 205A-N. In another embodiment, the control unit may drive one of the control signals high to pass the supply voltage through the chosen diode 210A-N. In this embodiment, transistors 205A-N may be n-channel transistors.

Figure 3:
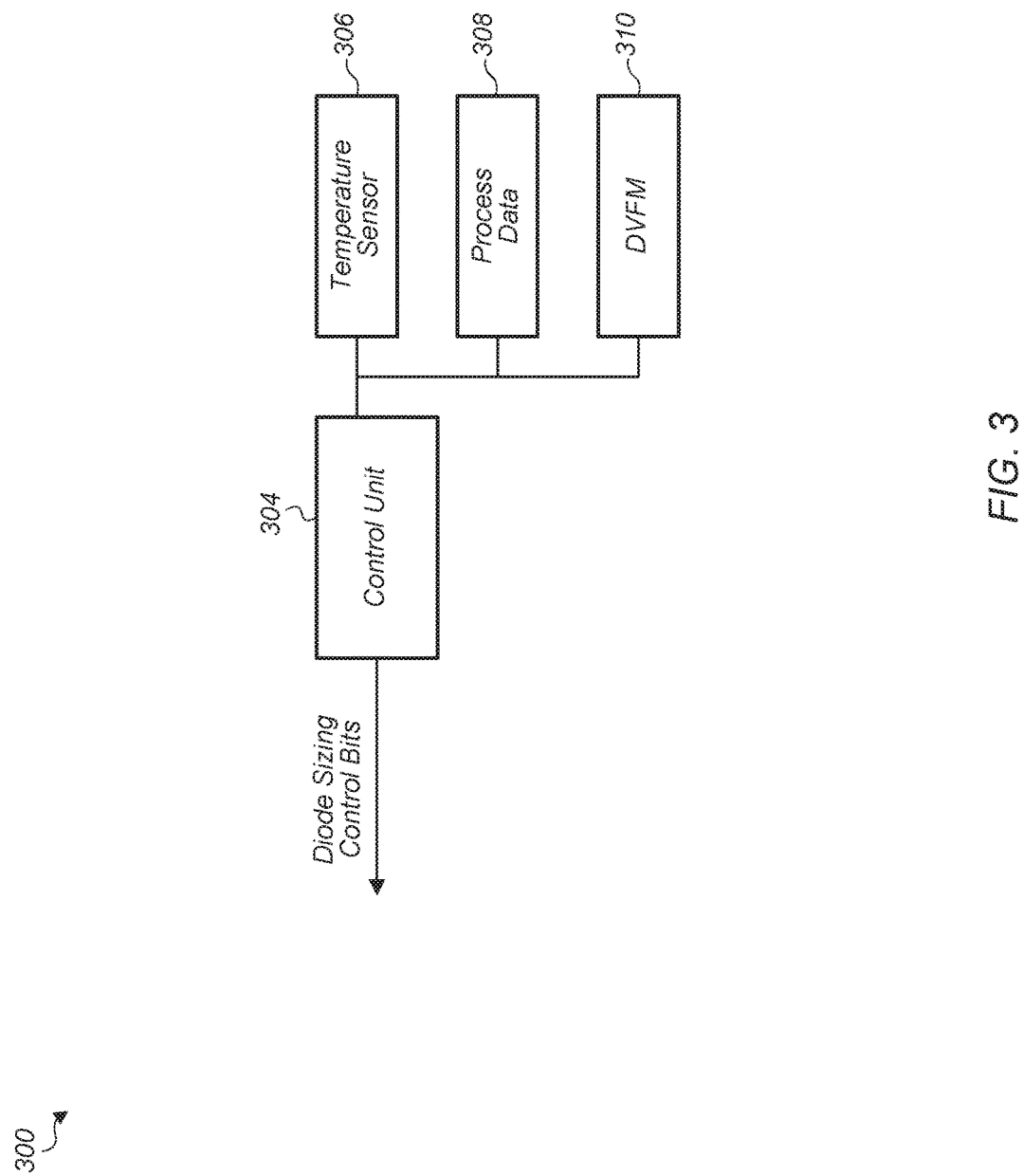
FIG. 3 is a diagram of one embodiment of a circuit to generate control bits for selecting a size of a diode.

Referring now to FIG. 3, a block diagram of one embodiment of a circuit 300 to generate control bits for selecting a size of a diode is shown. In one embodiment, circuit 300 can generate the control bits that are utilized to select one of the diode sizes from the diodes 210A-N of circuit 200 (of FIG. 2). In one embodiment, temperature sensor 306, process data 308, and DVFM unit 310 generate inputs to control unit 304. In other embodiments, a subset of these inputs and/or other inputs may be coupled to control unit 304. Control unit 304 is configured to generate control bits based on the values of these inputs. In one embodiment, control unit 304 includes a lookup table to generate the control bits from the various inputs. In other embodiments, control unit 304 may include other mechanisms for generating control bits.

Turning now to FIG. 4, one embodiment of a lookup table 400 for selecting a diode for generating an optimal supply voltage to minimize leakage current is shown. In one embodiment, a control unit (e.g., control unit 304 of FIG. 3) utilizes lookup table 400 for selecting the diode which will generate the optimal supply voltage for reducing leakage of SRAM bitcells. In one embodiment, lookup table 400 stores entries for different temperature ranges, with each temperature range associated with a corresponding diode which will generate the optimal retention voltage for the respective temperature range. In other embodiments, lookup table 400 can also include entries which utilize process variations and the voltage/frequency settings to determine which diode to select. The diodes have different sizes with different voltage drops from the input supply voltage at the input of the diode to the voltage level at the output of the diode. The diode which will provide a voltage drop which generates a supply voltage closest to the data retention voltage while not falling below the data retention voltage may be chosen by the control unit. As shown in table 400, there are eight diodes to choose from. However, in other embodiments, other numbers of diodes may be implemented in parallel with a single diode or multiple diodes being selected for generating the supply voltage for the SRAM array.

Figure 5:
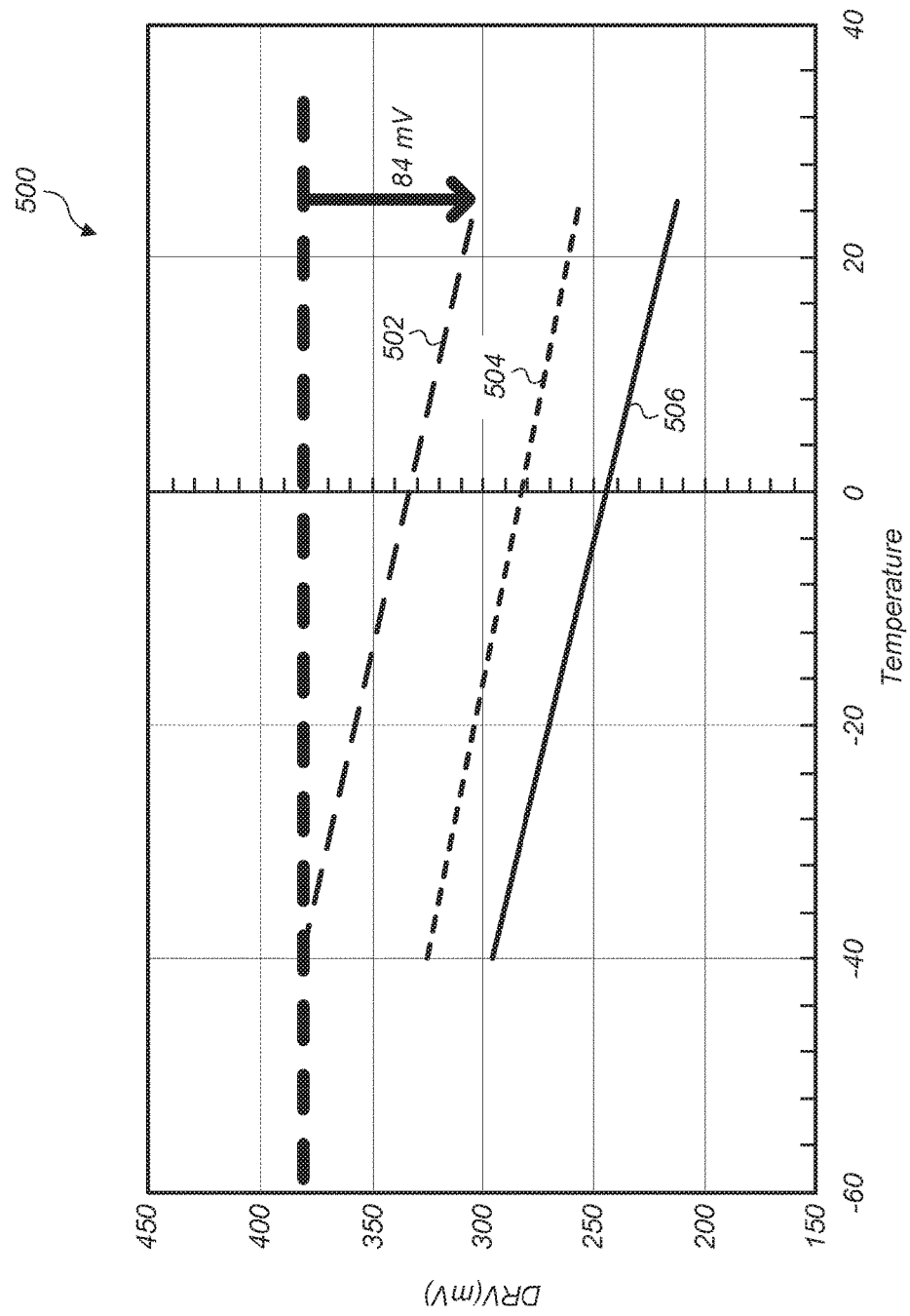
FIG. 5 illustrates a graph of the variation in the data retention voltage over temperature for an SRAM array.

Referring now to FIG. 5, a graph 500 illustrating the variation in the data retention voltage over temperature for an SRAM array is shown. Diagram 500 illustrates plots of the data retention voltage (DRV) versus temperature in Celsius for three different processes 502, 504, and 506. For the plot for process 502, there is an 84 millivolt (mV) difference between the DRV at −40° C. and room temperature of 25° C.

In the prior art, a diode providing the supply voltage for a SRAM array would be sized to provide a supply voltage greater than the DRV for the worst case scenario of −40° C. For these circuits, the typical scenario of operating the circuit at room temperature (approximately 25° C.) would cause the supply voltage to be about 84 mV higher than required to retain data, resulting in power being wasted due to an increase in the leakage current. However, by using circuit 200 shown in FIG. 2 and adaptively changing the diode size based on temperature, substantial reductions in leakage power may be achieved.

Figure 6:
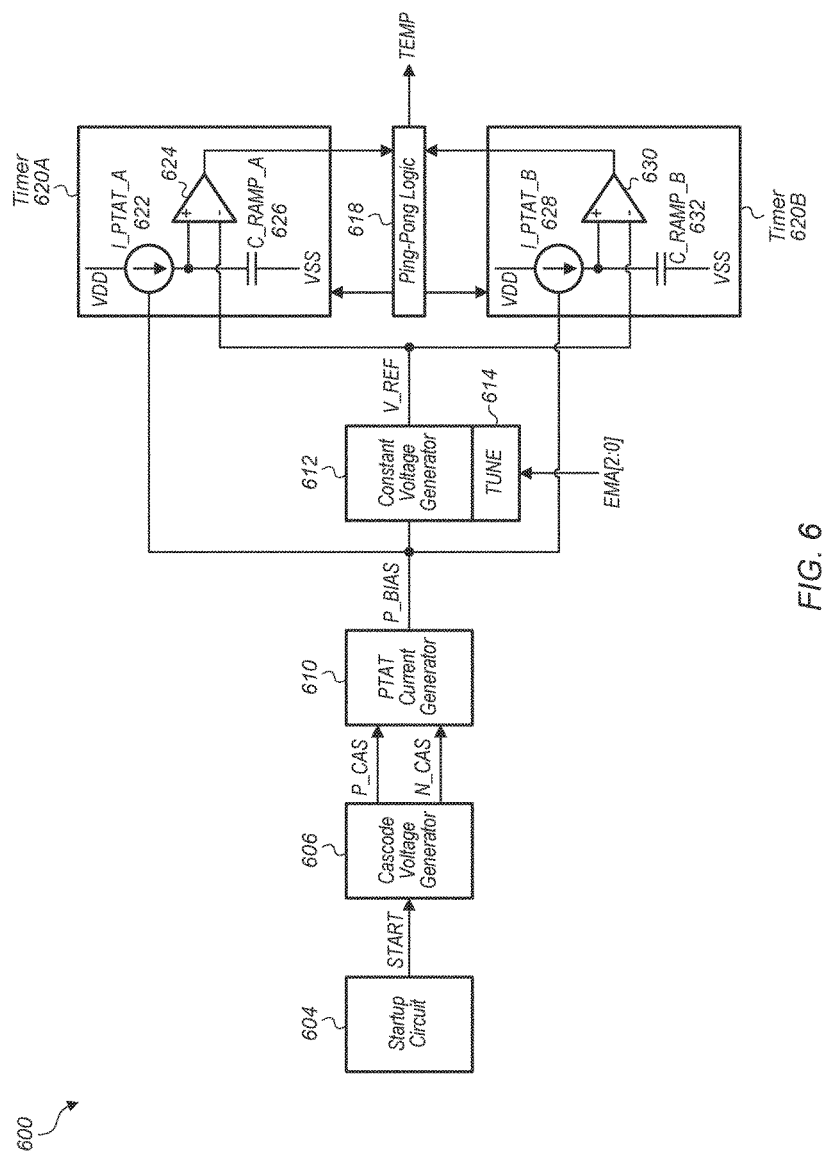
FIG. 6 is a block diagram of one embodiment of a circuit for implementing a temperature sensor.

Turning now to FIG. 6, a block diagram of one embodiment of a circuit 600 for implementing a temperature sensor is shown. In one embodiment, the elements of circuit 600 may be implemented as temperature sensor 106 (of FIG. 1). Circuit 600 includes startup circuit 604, cascode voltage generator 606, proportional to absolute temperature (PTAT) current generator 610, constant voltage generator 612, timers 620A-B, and ping-pong logic 618. In other embodiments, circuit 600 can include other units and/or be arranged in different configurations.

Startup circuit 604 is configured to generate a start signal which is conveyed to cascode voltage generator 606. Cascode voltage generator 606 is configured to generate voltage reference signals, P_CAS and N_CAS, to provide as inputs to PTAT current generator 610. One example of a cascode voltage generator is illustrated and described in more detail below in FIG. 7. PTAT current generator 610 is configured to generate the P_BIAS signal which is provided to constant voltage generator 612 and timers 620A-B. One example of a PTAT current generator is illustrated and described in more detail below in FIG. 7.

Constant voltage generator 612 is configured to generate a voltage reference signal (V_REF) which is coupled to the negative inputs of comparators 624 and 630 of timers 620A and 620B, respectively. The extra margin adjustment (EMA) bits are coupled to tuner 614 which is configured to tune constant voltage generator 612 based on temperature, process variation, and/or voltage/frequency settings. The signal P_BIAS is coupled from PTAT current generator 610 to current sources I_PTAT_A 622 and I_PTAT_B 628 of timers 620A and 620B, respectively. Current source 622 and 628 are configured to generate current sources to charge capacitors 626 and 632, respectively. The voltage of capacitor 626 is compared to the V_REF signal by comparator 624, with the output of comparator 624 coupled to ping-pong logic 618. Similarly, the voltage of capacitor 632 is compared to the V_REF signal by comparator 630, with the output of comparator 630 coupled to ping-pong logic 618. Ping-pong logic 618 utilizes the inputs from comparator 624 and comparator 630 to generate a temperature value.

Figure 7:
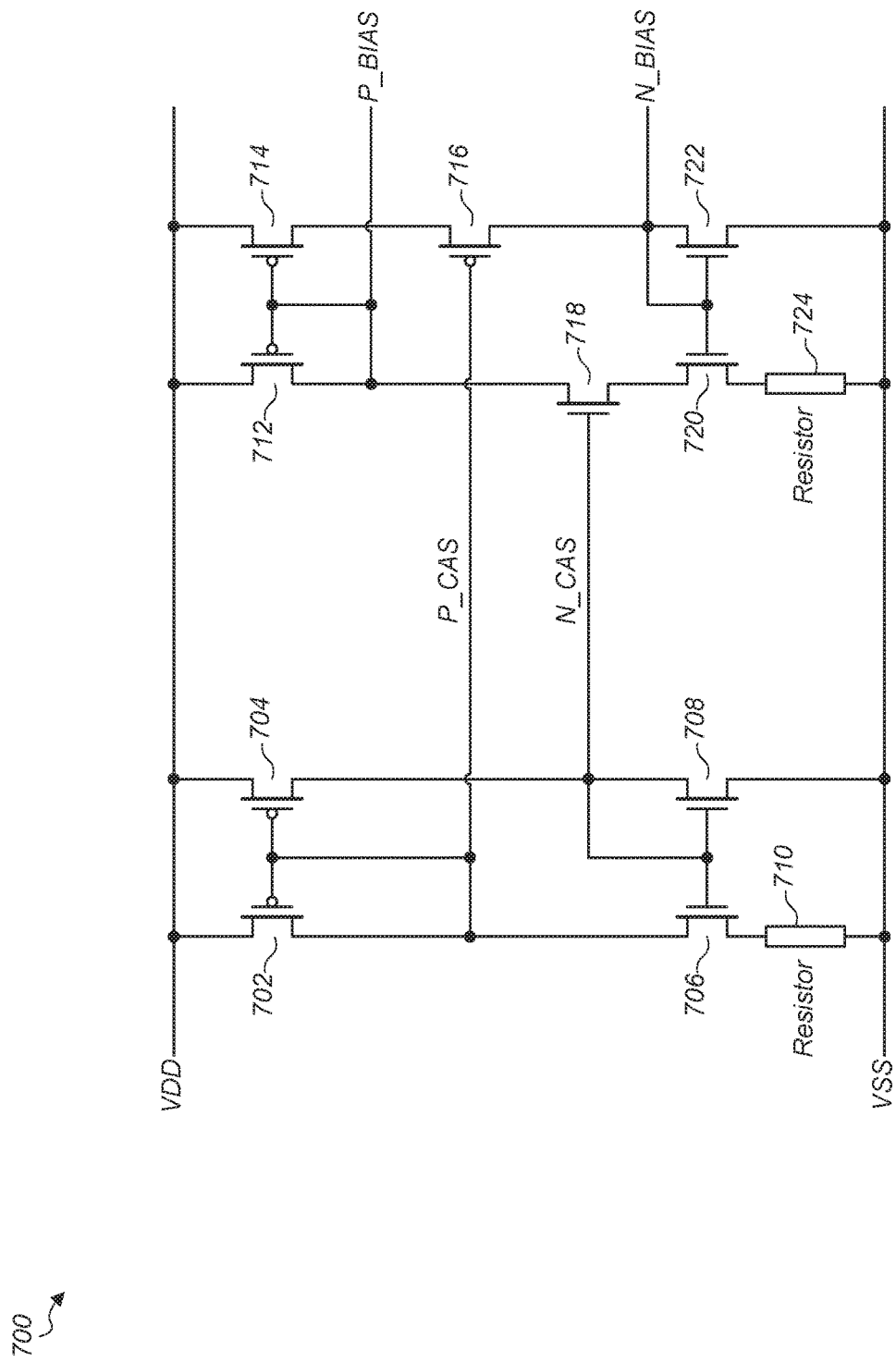
FIG. 7 is a diagram of one embodiment of a circuit for implementing a cascode voltage generator and a PTAT current generator.

Referring now to FIG. 7, a diagram of one embodiment of a circuit 700 for implementing a cascode voltage generator and a PTAT current generator is shown. In one embodiment, the elements of circuit 700 may be implemented as part of blocks 606 and 610 of circuit 600 (of FIG. 6). Circuit 700 includes p-channel transistors 702, 704, 712, 714, and 716, n-channel transistors 706, 708, 718, 720, and 722, and resistors 710 and 724. The types of transistors that are used for the transistors in circuit 700 and in the other circuits shown throughout this disclosure can vary from embodiment to embodiment. It is noted that, in various embodiments, a "transistor" may correspond to one or more transconductance elements such as a metal oxide semiconductor field-effect transistor (MOSFET), a junction field-effect transistor (JFET), a bipolar transistor, or others. For example, in one embodiment, each p-channel transistor may be a p-channel metal-oxide semiconductor (PMOS) transistor and each n-channel transistor may be an n-channel metal-oxide-semiconductor (NMOS) transistor. In other embodiments, the p-channel transistors and n-channel transistors shown in FIG. 7 and in other figures may be implemented using other types of transistors.

The source of p-channel transistor 702 is coupled to the supply voltage (VDD). The gate of p-channel transistor 702 is coupled to the gate of n-channel transistor 704. The supply voltage is coupled to the source of p-channel transistor 704, the source of p-channel transistor 712, and the source of p-channel transistor 714. The gates of p-channel transistors 702 and 704 are coupled to the drain of p-channel transistor 702 and to the gate of p-channel transistor 716, with this connection labeled as P_CAS. The drain of p-channel transistor 702 is coupled to the drain of n-channel transistor 706. The drain of p-channel transistor 704 is coupled to the drain of n-channel transistor 708 and the gate of n-channel transistor 718, with this connection labeled N_CAS. The source of n-channel transistor 706 is coupled to one end of resistor 710. The other end of resistor 710 coupled to ground (or VSS). In one embodiment, resistor 710 is a 20 kiloohm resistor. In other embodiments, resistor 710 may be other sizes of resistors. The source of n-channel transistor 708 is coupled to ground. The gate of n-channel transistor 706 is coupled to the gate and drain of n-channel transistor 708. With transistors 706 and 708 biased in the sub-threshold region of operation, the voltage across resistor 710 is independent of process and the power supply voltage.

The drain of p-channel transistor 712 is coupled to the gate of p-channel transistor 712 and to the gate of p-channel transistor 714, with this connection labeled as P_BIAS. The drain of p-channel transistor 712 is also coupled to the drain of n-channel transistor 718. The drain of p-channel transistor 714 is coupled to the source of p-channel transistor 716. The source of n-channel transistor 718 is coupled to the drain of n-channel transistor 720. The gate of n-channel transistor 720 is coupled to the gate of n-channel transistor 722 and to the drain of n-channel transistor 722, with this connection labeled as N_BIAS. The drain of n-channel transistor 722 is also coupled to the drain of p-channel transistor 716. The source of n-channel transistor 720 is coupled to one end of resistor 724. The other end of resistor 724 is coupled to ground. In one embodiment, resistor 724 is a 20 kiloohm resistor. In other embodiments, resistor 724 may be other sizes of resistors, with the size of resistor 724 matching the size of resistor 710. The source of n-channel transistor 722 is coupled to ground.

Figure 8:
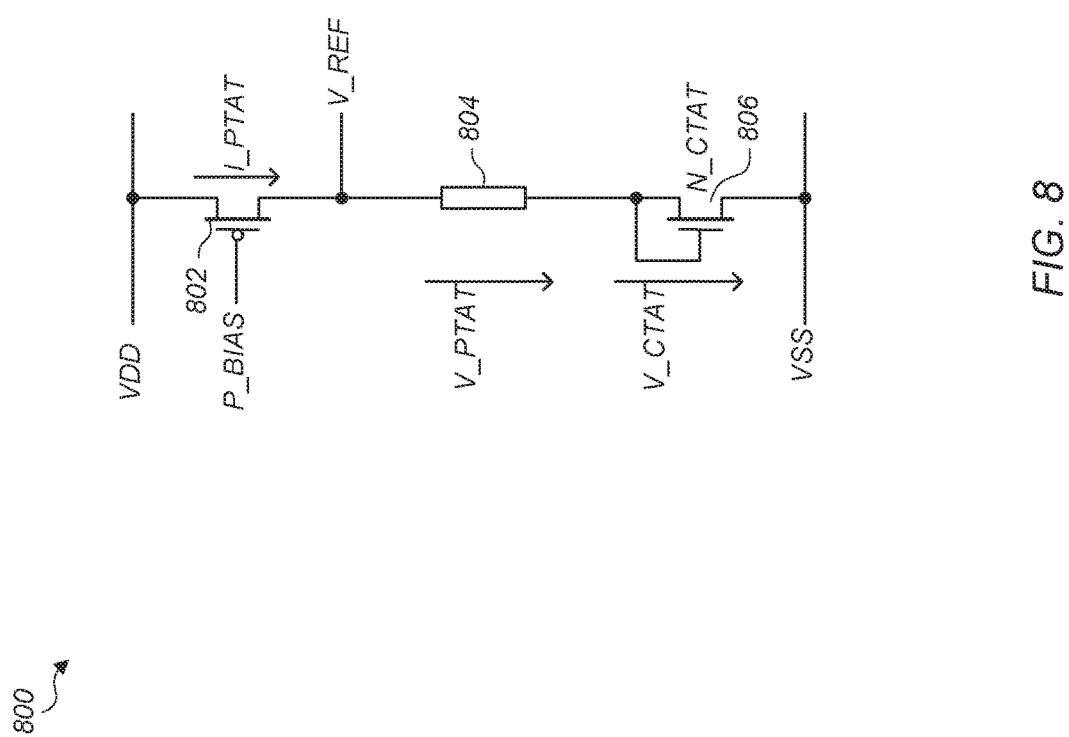
FIG. 8 is a diagram of one embodiment of a circuit for implementing a constant voltage generator.

Turning now to FIG. 8, a diagram of one embodiment of a circuit 800 for implementing a constant voltage generator is shown. In one embodiment, the circuit elements of circuit 800 may be implemented as part of constant voltage generator 612 (of FIG. 6). The source of p-channel transistor 802 is coupled to the supply voltage (VDD). The P_BIAS signal generated by a current generator (e.g., current generator 610 of FIG. 6) is coupled to the gate of p-channel transistor 802. The current flowing through p-channel transistor 802 is proportional to absolute temperature and is labeled as I_PTAT. The drain of p-channel transistor 802 is the output voltage reference signal from circuit 800 and is labeled as V_REF. The drain of p-channel transistor 802 is coupled to one end of resistor 804. The other end of resistor 804 is coupled to the drain of n-channel transistor 806. The voltage across resistor 804 is proportional to absolute temperature and is labeled as V_PTAT.

The drain of n-channel transistor 806 is coupled to the gate of n-channel transistor 806. The source of n-channel transistor 806 is coupled to ground. The voltage across n-channel transistor 806 is complementary to absolute temperature and is labeled as V_CTAT. Accordingly, since V_REF is the sum of V_PTAT and V_CTAT, V_REF is virtually independent of temperature.

Figure 9:
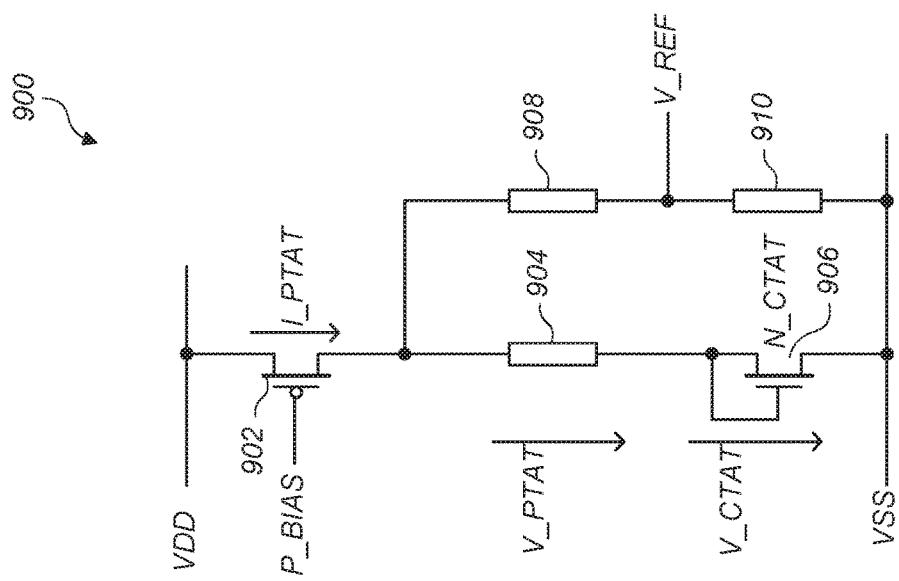
FIG. 9 is a diagram of another embodiment of a circuit for implementing a constant voltage generator.

Referring now to FIG. 9, a diagram of another embodiment of a circuit 900 for implementing a constant voltage generator is shown. In one embodiment, the circuit elements of circuit 900 may be implemented as part of constant voltage generator 612 (of FIG. 6). The source of p-channel transistor 902 is coupled to the supply voltage. The P_BIAS signal generated by a current generator (e.g., current generator 610 of FIG. 6) is coupled to the gate of p-channel transistor 902. The current flowing through p-channel transistor 902 is proportional to absolute temperature and is labeled as I_PTAT. The drain of p-channel transistor 902 is coupled to one end of resistor 904 and to one end of resistor 908. The other end of resistor 904 is coupled to the drain of n-channel transistor 906. The voltage across resistor 904 is proportional to absolute temperature and is labeled as V_PTAT. The drain of n-channel transistor 906 is coupled to the gate of n-channel transistor 906. The source of n-channel transistor 906 is coupled to ground. The voltage across n-channel transistor 906 is complementary to absolute temperature and is labeled as V_CTAT.

The other end of resistor 908 is coupled to one end of resistor 910. The other end of resistor 910 is coupled to ground. The connection between resistor 908 and resistor 910 is the output voltage reference signal from circuit 1000 and is labeled as V_REF. Since V_REF is proportional to the sum of V_PTAT and V_CTAT, V_REF is virtually temperature independent. The ratio of V_REF to the sum of V_PTAT and V_CTAT depends on the values of resistors 908 and 910, which may be selected to choose a value of V_REF which is appropriate for a given embodiment.

Figure 10:
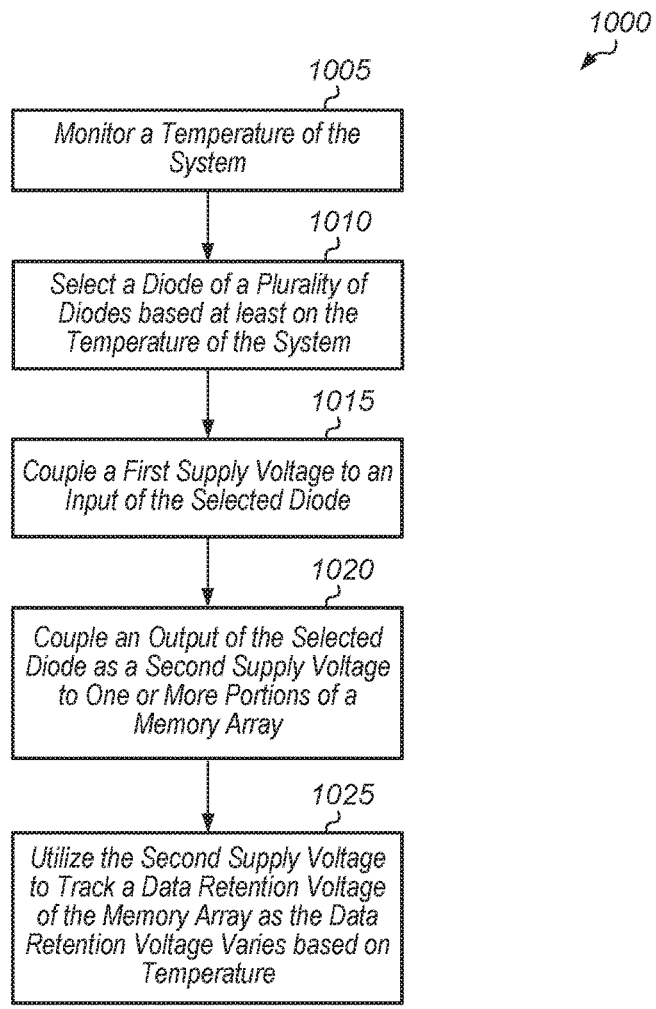
FIG. 10 is a generalized flow diagram illustrating one embodiment of a method for implementing an adaptive diode sizing mechanism.

Turning now to FIG. 10, one embodiment of a method 1000 for implementing an adaptive diode sizing mechanism is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems, apparatuses, and/or circuits described herein may be configured to implement method 1000.

A system is configured to monitor temperature (block 1005). The temperature of the system may also be referred to as the on-chip temperature. In some cases, the temperature may be associated with a memory array of the system. The system then selects a diode of a plurality of diodes based at least on the temperature of the system (block 1010). The system couples a first supply voltage to an input of the selected diode (block 1015).

The system couples an output of the selected diode as a second supply voltage to one or more portions of a memory array (block 1020). In one embodiment, the memory array is a SRAM array. In other embodiments, the memory array may be array of other types of memories, such as NAND or NOR Flash, or DRAM memory arrays. In one embodiment, the outputs of the plurality of diodes are connected together, and the voltage level of this connection is the second supply voltage. The second supply voltage is equal to the first supply voltage minus the voltage drop across the selected diode. The system utilizes the second supply voltage to track a data retention voltage of the memory array as the data retention voltage varies based on temperature (block 1025). After block 1025, method 1000 may end.

Figure 11:
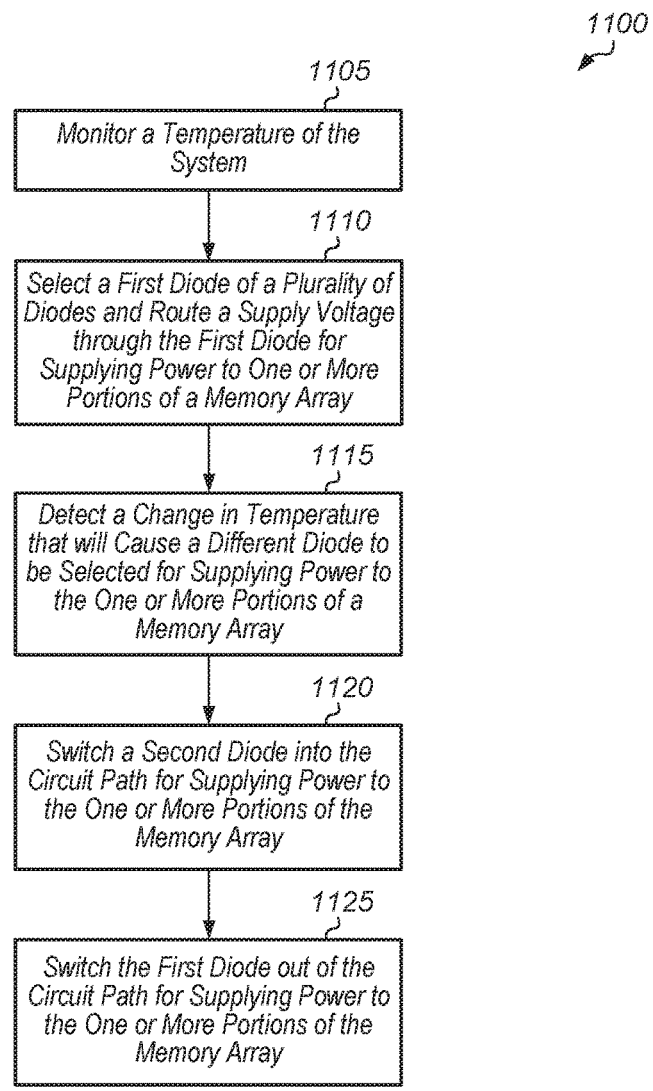
FIG. 11 is a generalized flow diagram illustrating another embodiment of a method for implementing an adaptive diode sizing mechanism.

Referring now to FIG. 11, another embodiment of a method 1100 for implementing an adaptive diode sizing mechanism is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems, apparatuses, and/or circuits described herein may be configured to implement method 1100.

A system is configured to monitor temperature (block 1105). Based on the temperature, the system selects a first diode of a plurality of diodes and routes a supply voltage through the first diode for supplying power to one or more portions of a memory array (block 1110). In one embodiment, the memory array is a SRAM array.

At a later point in time, the system detects a change in temperature that will cause a different diode to be selected for supplying power to the one or more portions of a memory array (block 1115). In response to detecting this change in temperature, the system switches a second diode into the circuit path for supplying power to the one or more portions of the memory array (block 1120). Also, the system switches the first diode out of the circuit path for supplying power for one or more portions of the memory array (block 1125). After block 1125, method 1100 may end.

Figure 12:
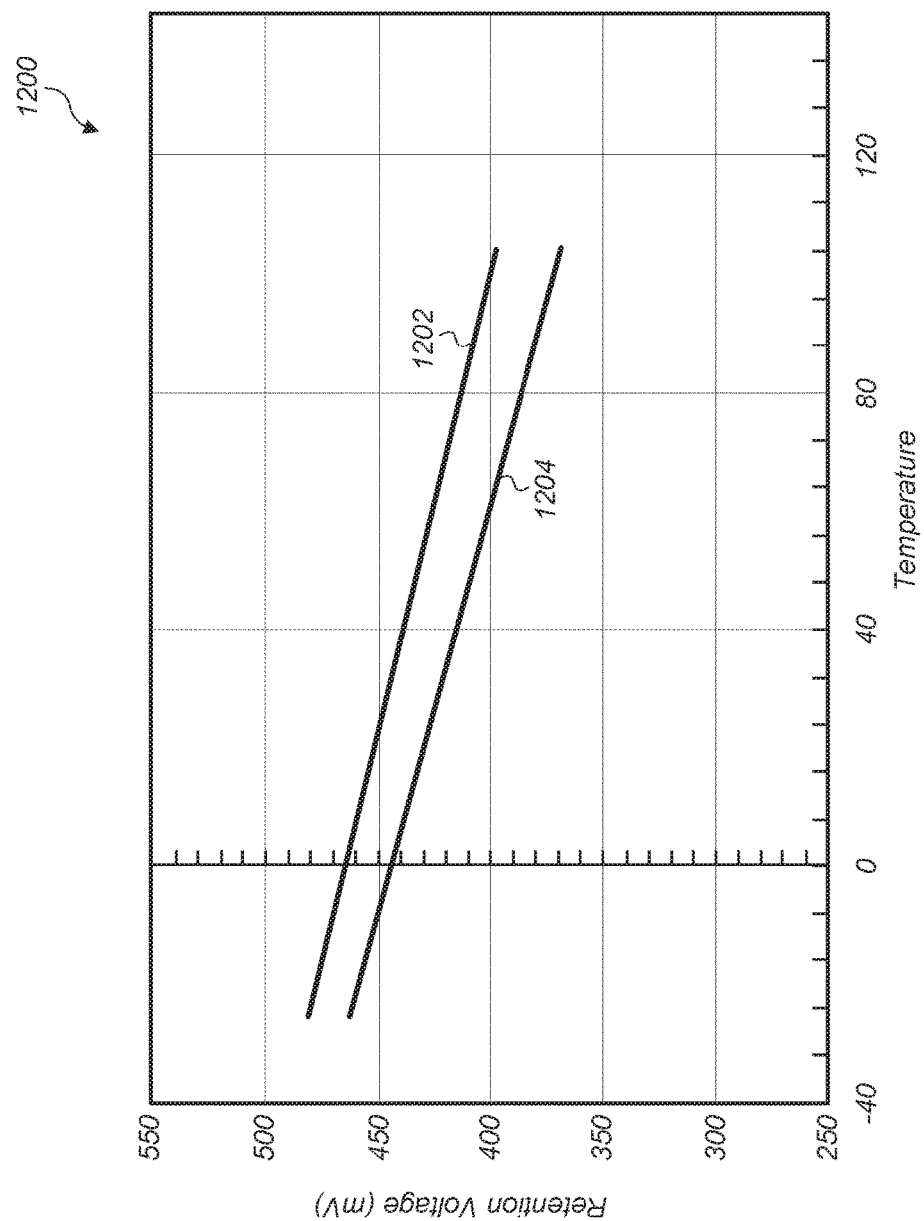
FIG. 12 is a graph of a minimum required voltage for the retention of data for an SRAM bitcell as it varies over temperature.

Referring now to FIG. 12, a graph 1200 of a retention voltage for an SRAM bitcell as it varies over temperature is shown. Line 1202 represents the retention voltage for an SRAM array fabricated using a first process. Line 1204 represents the retention voltage for an SRAM array fabricated using a second process. A typical circuit in the prior art would set the voltage supplied to an SRAM array in retention mode to be greater than or equal to the retention voltage at −25 Celsius (C). However, for a circuit at room temperature (25° C.), this circuit would be providing a supply voltage that is substantially higher than the retention voltage, resulting in wasted power. As will be described in further detail in the description associated with subsequent figures, a circuit that can track the change in the retention voltage due to temperature can achieve power savings for systems and apparatuses which include SRAM arrays. Additionally, circuits that can generate a supply voltage to automatically track changes in the retention voltage due to process variations during fabrication of the SRAM arrays and due to supply voltage fluctuations can also achieve power savings.

In one embodiment, a voltage threshold reference that is proportional to absolute temperature is generated using SRAM transistors biased in the sub-threshold region of operation. The current is mirrored between two branches, with a diode-connected n-channel transistor being run at a different current density than the mirror transistor. A resistor provides feedback that makes the circuit output voltage independent of the supply voltage. The voltage across the resistor is linear as a function of temperature, and therefore, so is the output current. The current also tracks linearly as a function of the SRAM leakage. The current from the voltage threshold reference is then mirrored into a circuit tracking the threshold voltages of a p-channel transistor and an n-channel transistor. Whichever threshold voltage is greater between these transistors is used as a set point for a voltage regulator to generate a supply voltage for an SRAM array which tracks the retention voltage.

Figure 13:
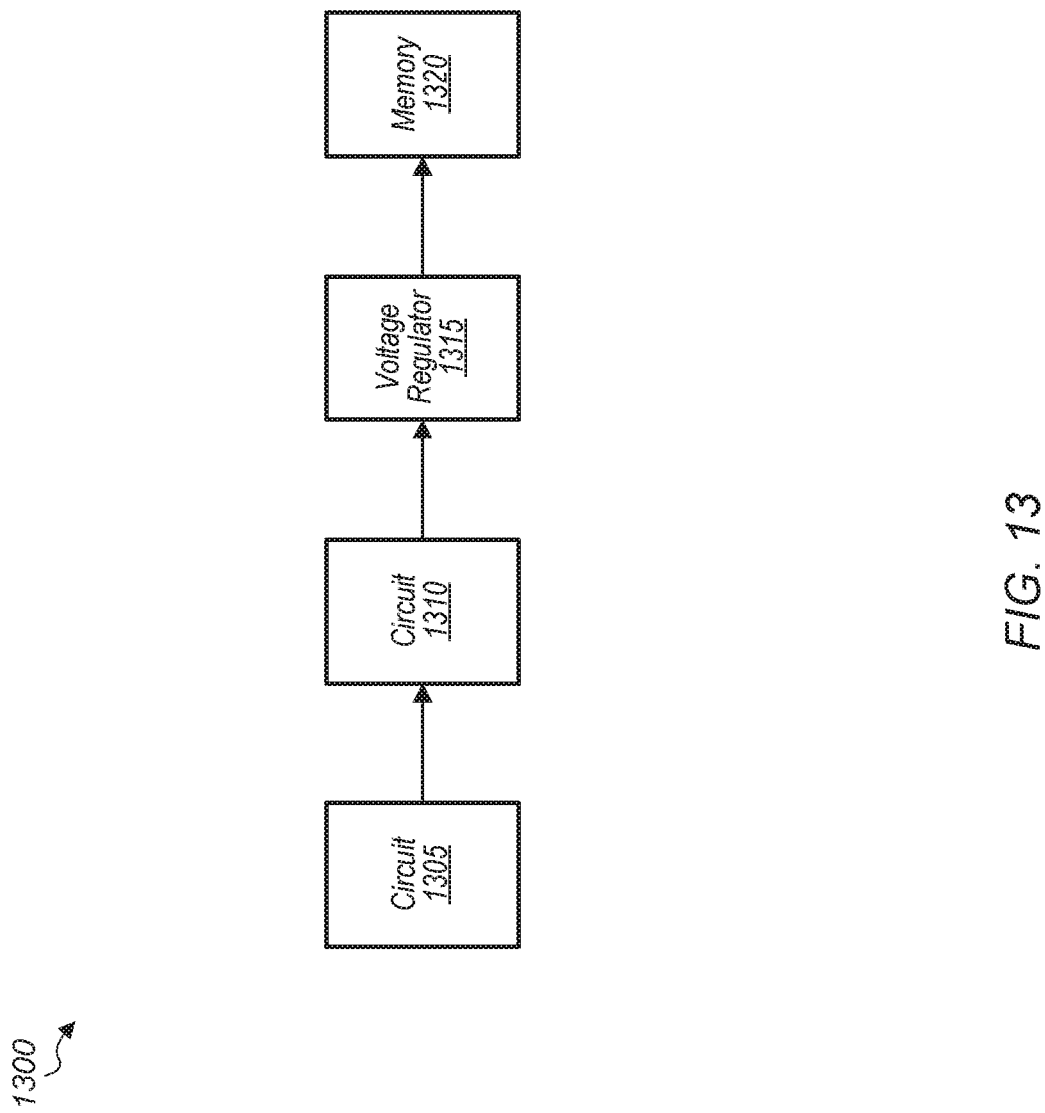
FIG. 13 is a block diagram of one embodiment of a system.

Turning now to FIG. 13, a block diagram of one embodiment of a system 1300 is shown. In various embodiments, system 1300 may be a system on chip (SoC), an integrated circuit (IC), or other types of systems. System 1300 includes at least circuit 1305, circuit 1310, voltage regulator 1315, and memory 1320. In one embodiment, memory 1320 is an SRAM array. In other embodiments, memory 1320 may be other types of memory units. In one embodiment, circuit 1305 and 1310 and voltage regulator 1315 may be considered part of the same circuit but are shown separately in FIG. 13 for the purposes of discussion.

Circuit 1305 is configured to track a leakage current indicative of the bitcells of the memory 1320 as the leakage current varies over temperature. For example, in one embodiment, circuit 1305 tracks a voltage threshold reference that is proportional to absolute temperature (PTAT) using SRAM transistors biased in the sub-threshold region of operation.

Circuit 1305 may provide a gate voltage to a pull-up transistor of circuit 1310. In one embodiment, circuit 1310 is configured to mirror the leakage current of circuit 1305 and track the higher threshold voltage of a p-channel transistor or an n-channel transistor, with the p-channel and n-channel transistors being matching transistors to the transistors in the bitcells of the memory 1320. In one embodiment, circuit 1310 includes a diode-connected p-channel tracking transistor which is wrapped inside a diode-connected n-channel tracking transistor. The voltage reference output generated by circuit 1310 is the logical OR of whichever of the p-channel and n-channel thresholds is higher. The higher of these thresholds is coupled as a voltage reference to voltage regulator 1315.

Voltage regulator 1315 supplies retention mode power to memory 1320 at a supply voltage proportional to the voltage reference generated by circuit 1310. The power supplied to memory 1320 by voltage regulator 1315 is at a voltage which tracks the retention voltage. In one embodiment, an optional margin may be added to the supply voltage by voltage regulator 1315 so that the supply voltage is at a level slightly higher than the retention voltage. This optional margin may be adjusted via one or more programmable circuit elements in circuit 1305 and/or circuit 1310. It is noted that system 1300 may also be referred to as an apparatus. It is also noted that system 1300 may include other components in addition to those shown in FIG. 13.

Figure 14:
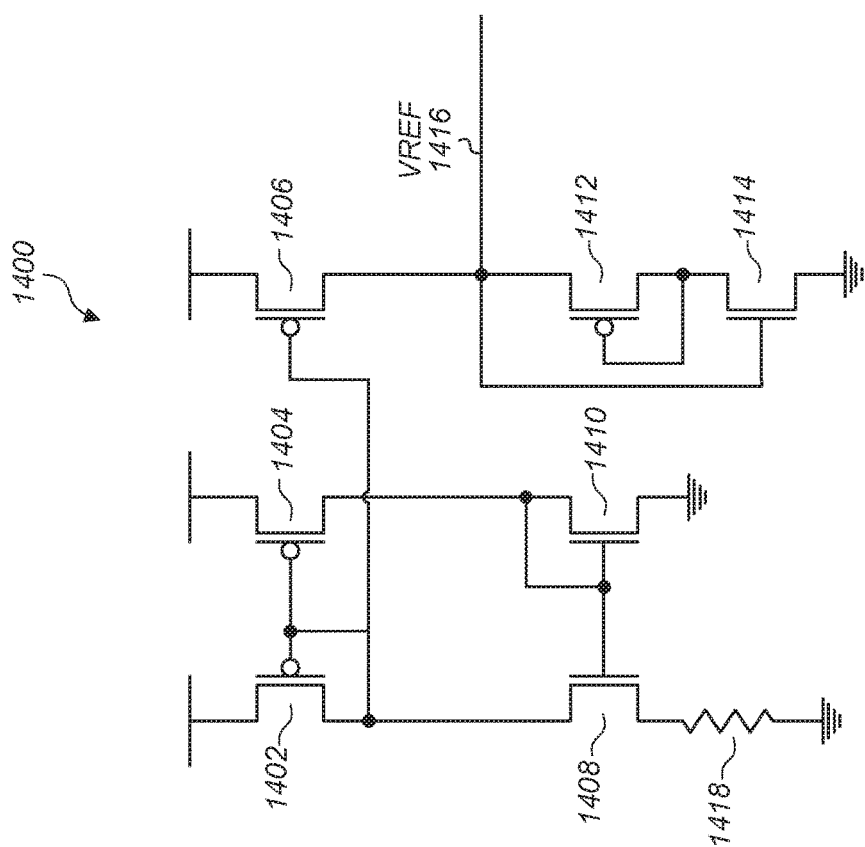
FIG. 14 is a diagram of one embodiment of a retention voltage tracking reference circuit.

Referring now to FIG. 14, a diagram of one embodiment of a retention voltage tracking reference circuit 1400 is shown. In one embodiment, retention voltage tracking reference circuit 1400 is coupled to a voltage regulator (not shown). Retention voltage tracking reference circuit 1400 is configured to supply a reference voltage (VREF 1416) to the voltage regulator, with VREF 1416 tracking the retention voltage of a static random-access memory (SRAM) array (e.g., SRAM array 1320 of FIG. 13). The voltage regulator may utilize VREF 1416 to generate a supply voltage for supplying power to the SRAM array. The reference voltage (VREF 1416) generated by circuit 1400 is able to track the retention voltage as it changes due to temperature, supply voltage, and process variations.

Retention tracking reference circuit 1400 includes p-channel transistors 1402, 1404, 1406, and 1412, n-channel transistors 1408, 1410, and 1414, and resistor 1418. In one embodiment, p-channel transistors 1404 and 1406 may be programmable to add a margin to VREF 1416. The gate of p-channel transistor 1402 is coupled to the gates of p-channel transistors 1404 and 1406. The gate of p-channel transistor 1402 is also coupled to the drain of p-channel transistor 1402. It is noted that p-channel transistor 1402 may also be referred to as a pull-up transistor. The source of p-channel transistor 1402 is coupled to the supply voltage for circuit 1400. The drain of p-channel transistor 1402 is coupled to the drain of n-channel transistor 1408. The source of n-channel transistor 1408 is coupled to one end of resistor 1418 with the other end of resistor 1418 coupled to ground. The resistance of resistor 1418 may vary from embodiment to embodiment, with the higher the resistance, the lower the amount of power which is lost through resistor 1418.

The gate of n-channel transistor 1408 is coupled to the gate of n-channel transistor 1410, with the gate of n-channel transistor 1410 also coupled to the drain of n-channel of transistor 1410. The drain of n-channel transistor 1410 is also coupled to the drain of p-channel transistor 1404. The source of n-channel transistor 1410 is coupled to ground. It is noted that n-channel transistor 1410 may also be referred to as a pull-down transistor.

The sources of p-channel transistors 1404 and 1406 are coupled to the supply voltage, and the drain of p-channel transistor 1406 is coupled to the source of p-channel transistor 1412. P-channel transistor 1412 is connected such that it functions similar to a diode. The drain of p-channel transistor 1412 is coupled to the gate of p-channel transistor 1412 and to the drain of n-channel transistor 1414. The source of n-channel transistor 1414 is coupled to ground. The gate of n-channel transistor 1414 is coupled to the drain of p-channel transistor 1406 and is the voltage reference (or VREF) signal 1416. The connections of transistor 1412 and 1414 serve as a logical OR of two analog voltages, with VREF signal 1416 generated as the higher of the threshold voltages of p-channel transistor 1412 and n-channel transistor 1414. In one embodiment, p-channel transistor 1412 and n-channel transistor 1414 match the p-channel and n-channel transistors used in the SRAM array. Accordingly, these circuit elements are able to track changes in the threshold voltages due to process variations during fabrication.

The types of transistors that are used for the transistors in circuit 1400 can vary from embodiment to embodiment. It is noted that, in various embodiments, a "transistor" may correspond to one or more transconductance elements such as a metal oxide semiconductor field-effect transistor (MOSFET), a junction field-effect transistor (JFET), a bipolar transistor, or others. For example, in one embodiment, each p-channel transistor may be a p-channel metal-oxide semiconductor (PMOS) transistor and each n-channel transistor may be an n-channel metal-oxide-semiconductor (NMOS) transistor. In one embodiment, the circuit elements of 1400 may be used to construct circuits 1305 and 1310 (of FIG. 13).

Figure 15:
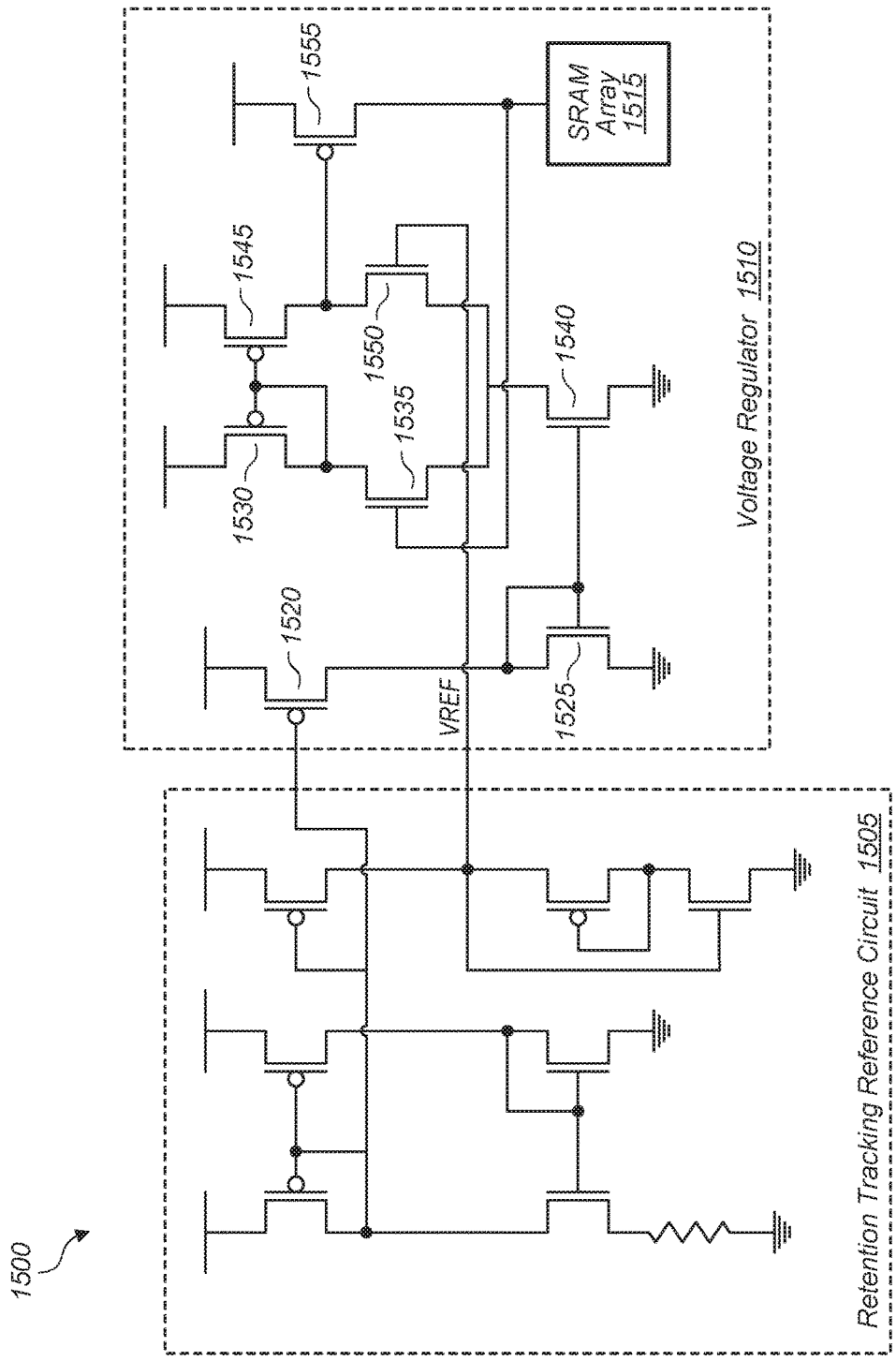
FIG. 15 is a diagram of one embodiment of a circuit.

Turning now to FIG. 15, a diagram of one embodiment of a circuit 1500 is shown. Circuit 1500 includes retention tracking reference circuit 1505 and voltage regulator circuit 1510. It is noted that retention tracking reference circuit 1505 is equivalent to circuit 1400 (of FIG. 14). The gates of the p-channel transistors at the top of retention tracking reference circuit 1505 are coupled together and these gates are also coupled to the gate of p-channel transistor 1520 of voltage regulator circuit 1510. The source of p-channel transistor 1520 is coupled to the supply voltage, and the drain of p-channel transistor 1520 is coupled to the drain of n-channel transistor 1525. The gate of n-channel transistor 1525 is coupled to the drain of n-channel transistor 1525 and to the gate of n-channel transistor 1540. The sources of n-channel transistor 1525 and n-channel transistor 1540 are coupled to ground.

The gate of p-channel transistor 1530 is coupled to the gate of p-channel transistor 1545 and to the drain of p-channel transistor 1530. The sources of p-channel transistor 1530 and p-channel transistor 1545 are coupled to the supply voltage. The drain of p-channel transistor 1530 is coupled to the drain of n-channel transistor 1535. The drain of p-channel transistor 1545 is coupled to the drain of n-channel transistor 1550 and to the gate of p-channel transistor 1555. The source of p-channel transistor 1555 is coupled to the supply voltage. The source of n-channel transistor 1535 is coupled to the source of n-channel transistor 1550 and to the drain of n-channel transistor 1540. The voltage reference signal generated by circuit 1505 and labeled as VREF is coupled to the gate of n-channel transistor 1550. The gate of n-channel transistor 1535 is coupled to the drain of p-channel transistor 1555, with this voltage tracking VREF. The drain of p-channel transistor 1555 is also coupled as an input to SRAM array 1515 and is used as the retention voltage of SRAM array 1515.

Figure 16:
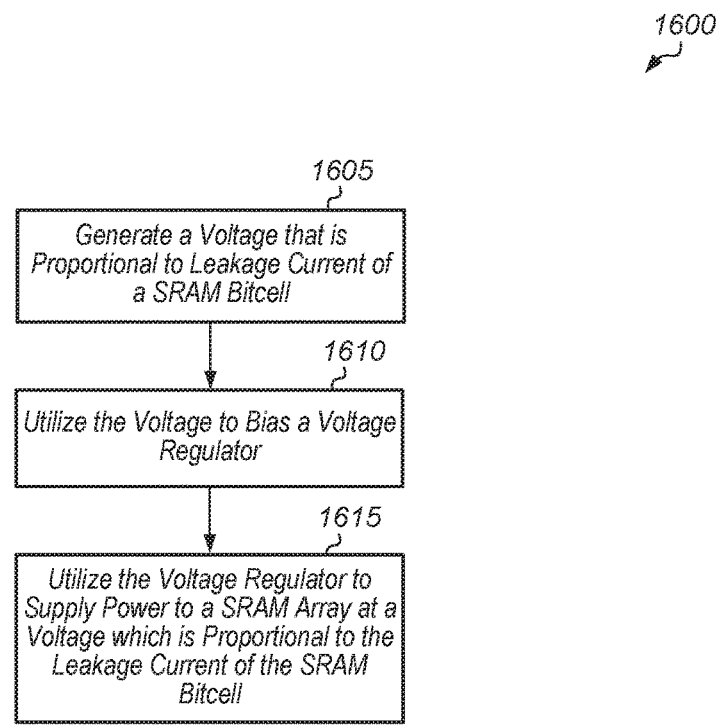
FIG. 16 is a generalized flow diagram illustrating one embodiment of a method for supplying a standby voltage of a memory array.

Referring now to FIG. 16, one embodiment of a method 1600 for supplying a standby voltage of a memory array is shown. In some embodiments, method 1600 may be used for supplying a standby voltage to an SRAM array but in other embodiments, method 1600 may be used for supplying a standby voltage to other types of memory arrays. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems, apparatuses, and/or circuits described herein may be configured to implement method 1600.

A circuit is configured to generate a voltage that is proportional to leakage current of a static random-access memory (SRAM) bitcell (block 1605). In one embodiment, generating a current that is proportional to the leakage current of an SRAM bitcell comprises biasing an n-channel transistor so that the n-channel is in a sub-threshold region of operation to track the leakage current of an SRAM bitcell as the leakage current varies over temperature. The circuit utilizes the voltage to bias a voltage regulator (block 1610). The circuit utilizes the voltage regulator to supply power to an SRAM array at a voltage which is proportional to the leakage current of the SRAM bitcell (block 1615). After block 1615, method 1600 may end.

Figure 17:
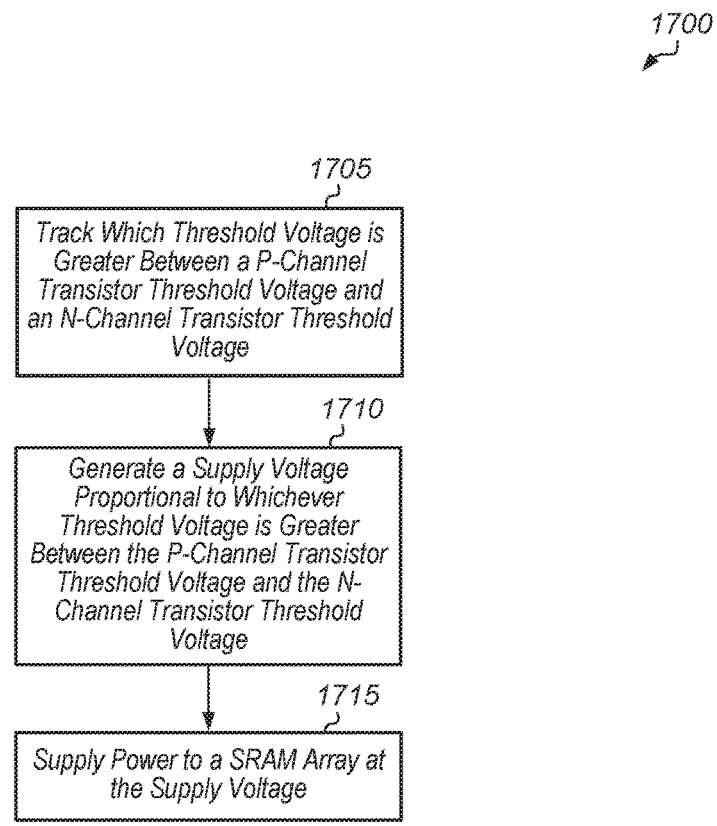
FIG. 17 is a generalized flow diagram illustrating another embodiment of a method for supplying a standby voltage of a memory array.

Referring now to FIG. 17, another embodiment of a method 1700 for supplying a standby voltage of a memory array is shown. In some embodiments, method 1700 may be used for supplying a standby voltage to an SRAM array but in other embodiments, method 1700 may be used for supplying a standby voltage to other types of memory arrays. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems, apparatuses, and/or circuits described herein may be configured to implement method 1700.

A circuit tracks which threshold voltage is greater between a p-channel transistor threshold voltage and an n-channel transistor threshold voltage (block 1705). In one embodiment, the circuit tracks which threshold voltage is greater by connecting a p-channel transistor in series with an n-channel transistor, connecting a gate of the p-channel transistor to a drain of the p-channel transistor, and connecting a gate of the n-channel transistor to a source of the p-channel transistor. The circuit mirrors leakage current of an SRAM bitcell through the p-channel transistor and the n-channel transistor connected in series.

The circuit generates a supply voltage proportional to whichever threshold voltage is greater between the p-channel transistor threshold voltage and the n-channel transistor threshold voltage (block 1710). In one embodiment, the supply voltage may be set equal to whichever threshold voltage is greater. In another embodiment, a margin may be added to whichever threshold voltage is greater, and then the supply voltage may be generated so that it is equal to the sum of the margin and the threshold voltage. The circuit supplies power to an SRAM array at the supply voltage (block 1715). In one embodiment, a device type of the n-channel transistor is a same device type as n-channel transistors of the bitcells of the SRAM array, and a device type of the p-channel transistor is a same device type as p-channel transistors of the bitcells of the SRAM array. After block 1715, method 1700 may end.

Figure 18:
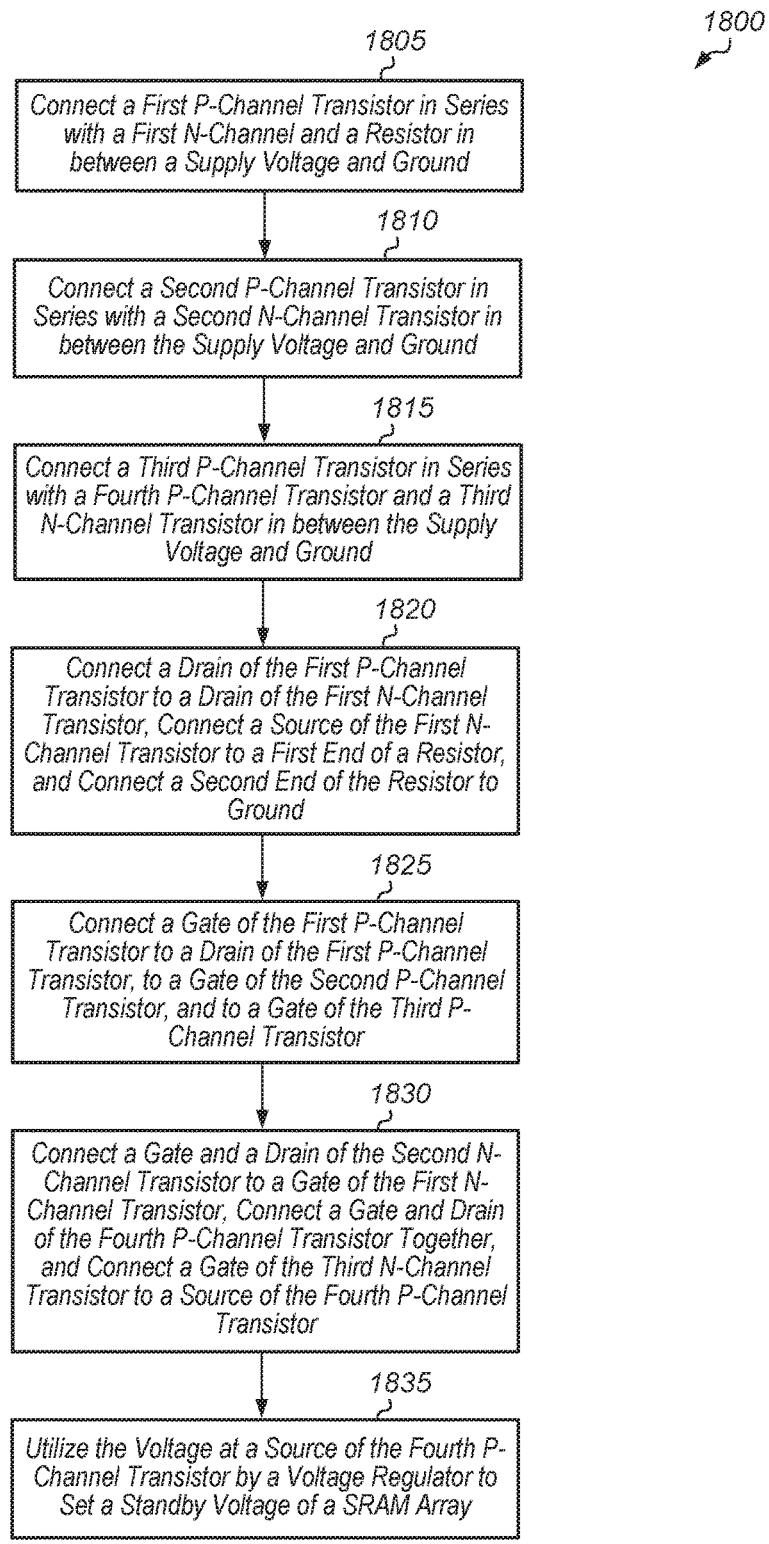
FIG. 18 is a generalized flow diagram illustrating one embodiment of a method for fabricating a circuit for generating a standby voltage of a memory array.

Referring now to FIG. 18, one embodiment of a method 1800 for fabricating a circuit for generating a standby voltage for a memory array is shown. In some embodiments, method 1800 may be used for fabricating a circuit for an SRAM array but in other embodiments, method 1800 may be used for fabricating a circuit for other types of memory arrays. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems, apparatuses, and/or circuits described herein may be configured to implement method 1800.

A first p-channel transistor is connected in series with a first n-channel transistor and a resistor in between a supply voltage and ground (block 1805). A second p-channel transistor is connected in series with a second n-channel transistor in between the supply voltage and ground (block 1810). A third p-channel transistor is connected in series with a fourth p-channel transistor and a third n-channel transistor in between the supply voltage and ground (block 1815). In one embodiment, the fourth p-channel transistor is a same type of p-channel transistor used in bitcells of the SRAM array, and the first, second, and third n-channel transistors are a same type of n-channel transistor used in bitcells of the SRAM array.

A drain of the first p-channel transistor is connected to a drain of the first n-channel transistor, a source of the first n-channel transistor is connected to a first end of the resistor, and a second end of the resistor is connected to ground (block 1820). A gate of the first p-channel transistor is connected to a drain of the first p-channel transistor, to a gate of the second p-channel transistor, and to a gate of the third p-channel transistor (block 1825). A gate and a drain of the second n-channel transistor are connected to a gate of the first n-channel transistor, a gate and drain of the fourth p-channel transistor are connected together, and a gate of the third n-channel transistor is connected to a source of the fourth p-channel transistor (block 1830). Additionally, a voltage at a source of the fourth p-channel transistor is utilized by a voltage regulator to set a standby voltage of an SRAM array (block 1835). After block 1835, method 1800 may end.

Figure 19:
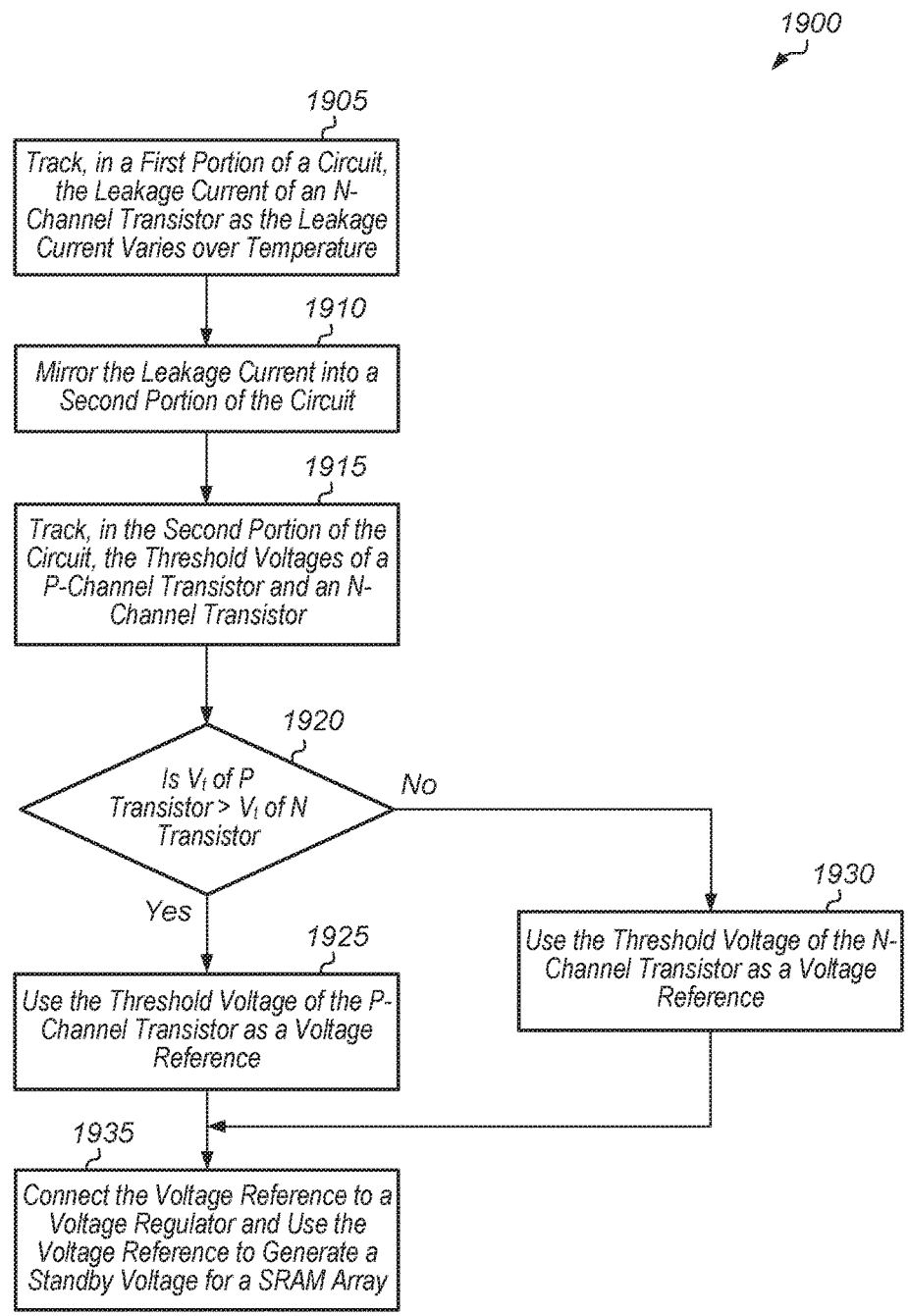
FIG. 19 is a generalized flow diagram illustrating one embodiment of a method for generating a voltage reference.

Turning now to FIG. 19, one embodiment of a method 1900 for generating a voltage reference is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems, apparatuses, and/or circuits described herein may be configured to implement method 1900.

A first portion of a circuit tracks the leakage current of an n-channel transistor as the leakage current varies over temperature (block 1905). In one embodiment, circuit 1305 of (FIG. 13) may be used to track the leakage current as it varies over temperature. Then, the leakage current is mirrored into a second portion of the circuit (block 1910). In one embodiment, the leakage current may be mirrored from circuit 1305 into circuit 1310. The second portion of the circuit tracks the threshold voltages of a p-channel transistor and an n-channel transistor (block 1915). The second portion of the circuit tracks for process variations during fabrication of the SRAM bitcells. The p-channel transistor and n-channel transistor in the second portion of the circuit match the p-channel transistor and n-channel transistor, respectively, used in the bitcells of the SRAM array.

If the threshold voltage ($V_t$) of the p-channel transistor is greater than the threshold voltage of the n-channel transistor as tracked by the second portion of the circuit (conditional block 1920, "yes" leg), then the threshold voltage of the p-channel transistor is used as the retention voltage of the SRAM array (block 1925). Otherwise, if the threshold voltage of the n-channel transistor is greater than the threshold voltage of the p-channel transistor (conditional block 1920, "no" leg), then the threshold voltage of the n-channel transistor is used as the voltage reference (block 1930). Then, after blocks 1925 and 1930, the voltage reference is connected to a voltage regulator and used to generate a standby voltage for an SRAM array (block 1935). After block 1935, method 1900 may end.

Figure 20:
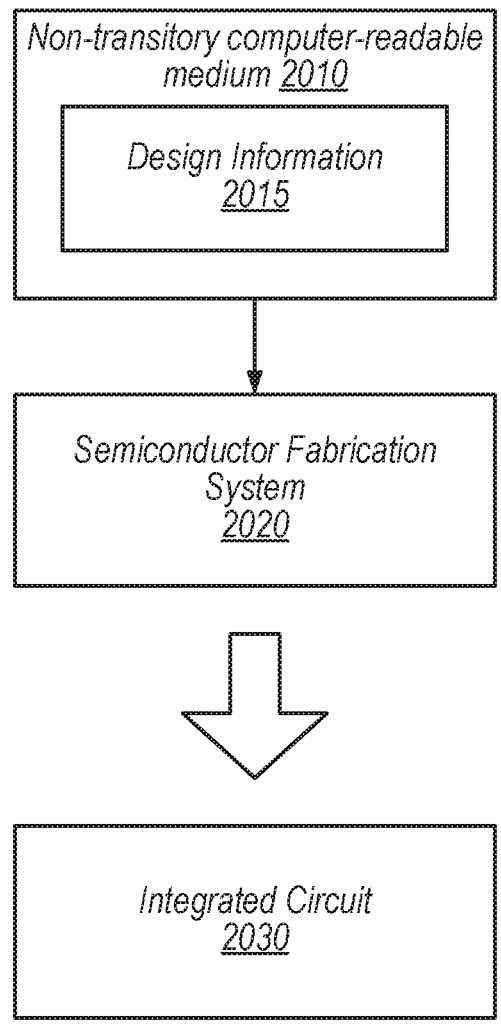
FIG. 20 is a block diagram illustrating an exemplary non-transitory computer-readable storage medium that stores circuit design information.

Turning now to FIG. 20, a block diagram illustrating an exemplary non-transitory computer-readable storage medium that stores circuit design information is shown. In the illustrated embodiment, semiconductor fabrication system 2020 is configured to process the design information 2015 stored on non-transitory computer-readable medium 2010 and fabricate integrated circuit 2030 based on the design information 2015.

Non-transitory computer-readable medium 2010 may comprise any of various appropriate types of memory devices or storage devices. Medium 2010 may be an installation medium, (e.g., a CD-ROM, floppy disks, or tape device) a computer system memory or random access memory (e.g., DRAM, DDR RAM, SRAM, EDO RAM, Rambus RAM), a non-volatile memory (e.g., a Flash, magnetic media, a hard drive, optical storage), registers, or other types of memory elements. Medium 2010 may include other types of non-transitory memory as well or combinations thereof. Medium 2010 may include two or more memory mediums which may reside in different locations (e.g., in different computer systems that are connected over a network).

Design information 2015 may be specified using any of various appropriate computer languages, including hardware description languages such as, without limitation: VHDL, Verilog, SystemC, SystemVerilog, RHDL, M, MyHDL, etc. Design information 2015 may be usable by semiconductor fabrication system 2020 to fabricate at least a portion of integrated circuit 2030. The format of design information 2015 may be recognized by at least one semiconductor fabrication system 2020. In some embodiments, design information 2015 may also include one or more cell libraries which specify the synthesis and/or layout of integrated circuit 2030.

Semiconductor fabrication system 2020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 2020 may also be configured to perform testing of fabricated circuits for correct operation.

In various embodiments, integrated circuit 2030 is configured to operate according to a circuit design specified by design information 2015, which may include performing any of the functionality described herein. For example, integrated circuit 2030 may include any of various elements shown in FIGS. 1-3, 6-9, and 13-15. Furthermore, integrated circuit 2030 may be configured to perform various functions described herein in conjunction with other components. For example, integrated circuit 2030 may be coupled to voltage supply circuitry that is configured to provide a supply voltage (e.g., as opposed to including a voltage supply itself). Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Figure 21:
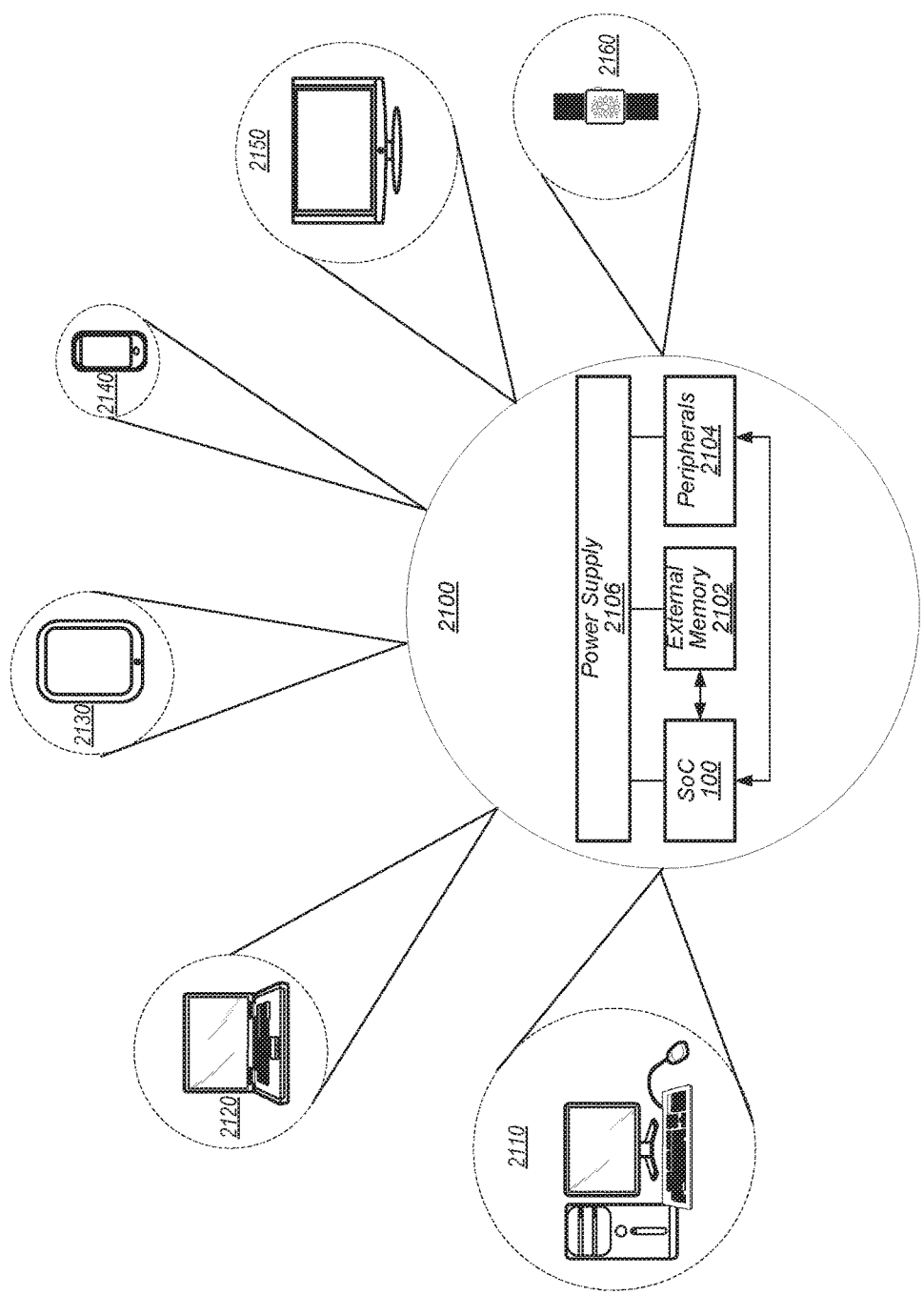
FIG. 21 is a block diagram of one embodiment of a system.

Referring next to FIG. 21, a block diagram of one embodiment of a system 2100 is shown. As shown, system 2100 may represent chip, circuitry, components, etc., of a desktop computer 2110, laptop computer 2120, tablet computer 2130, cell phone 2140, television 2150 (or set top box configured to be coupled to a television), wrist watch or other wearable item 2160, or otherwise. Other devices are possible and are contemplated. In the illustrated embodiment, the system 2100 includes at least one instance of SoC 100 (of FIG. 1) coupled to an external memory 2102. Alternatively, in another embodiment, the system 2100 includes at least one instance of SoC 1300 (of FIG. 13) coupled to an external memory 2102.

SoC 100 is coupled to one or more peripherals 2104 and the external memory 2102. A power supply 2106 is also provided which supplies the supply voltages to SoC 100 as well as one or more supply voltages to the memory 2102 and/or the peripherals 2104. In various embodiments, power supply 2106 may represent a battery (e.g., a rechargeable battery in a smart phone, laptop or tablet computer). In some embodiments, more than one instance of SoC 100 may be included (and more than one external memory 2102 may be included as well).

The memory 2102 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAIVIBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with SoC 100 in a chip-on-chip configuration, a package-on-package configuration, or a multi-chip module configuration.

The peripherals 2104 may include any desired circuitry, depending on the type of system 2100. For example, in one embodiment, peripherals 2104 may include devices for various types of wireless communication, such as wifi, Bluetooth, cellular, global positioning system, etc. The peripherals 2104 may also include additional storage, including RAM storage, solid state storage, or disk storage. The peripherals 2104 may include user interface devices such as a display screen, including touch display screens or multitouch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
   a plurality of transistors; and
   a resistor;
   wherein a first p-channel transistor is coupled in series with a first n-channel transistor and the resistor in between a supply voltage and ground;
   wherein a second p-channel transistor is coupled in series with a second n-channel transistor in between the supply voltage and ground;
   wherein a third p-channel transistor is coupled in series with a fourth p-channel transistor and a third n-channel transistor in between the supply voltage and ground;
   wherein a gate of the third n-channel transistor is utilized to set a supply voltage for a memory array in retention mode; and
   wherein the circuit is configured to track which threshold voltage is greater between the fourth p-channel threshold voltage and the third n-channel threshold voltage.

2. The circuit as recited in claim 1, wherein the gate of the n-channel transistor is a voltage reference signal which is coupled to a voltage regulator.

3. The circuit as recited in claim 2, wherein the voltage regulator comprises:
   a fifth p-channel transistor coupled in series with a fourth n-channel transistor between the supply voltage and ground;
   a sixth p-channel transistor coupled in series with a fifth n-channel transistor between the supply voltage and a sixth n-channel transistor, wherein the sixth n-channel transistor is coupled to ground;
   a seventh p-channel transistor coupled in series with a seventh n-channel transistor between the supply voltage and the sixth n-channel transistor;
   an eighth p-channel transistor connected to the supply voltage and a memory array, wherein a gate of the eight p-channel electrode is coupled to a drain of the seventh p-channel transistor, and wherein a drain electrode of the eighth p-channel transistor supplies a retention voltage reference to the memory array.

4. The circuit as recited in claim 3, wherein a drain of the first p-channel transistor is coupled to a drain of the first n-channel transistor, wherein a source of the first n-channel transistor is coupled to a first end of the resistor, wherein a second end of the resistor is coupled to ground, and wherein a gate of the first p-channel transistor is coupled to:
   a drain of the first p-channel transistor;
   a gate of the second p-channel transistor;
   a gate of the third p-channel transistor; and
   a gate of the fifth p-channel transistor.

5. The circuit as recited in claim 4, wherein a gate of the second n-channel transistor is coupled to a gate of the first n-channel transistor and to a drain of the second n-channel transistor, wherein a gate of the fourth p-channel transistor is coupled to a drain of the fourth p-channel transistor and to a drain of the third n-channel transistor, and wherein the gate of the third n-channel transistor is coupled to a source of the fourth p-channel transistor.

6. The circuit as recited in claim 5, wherein a gate of the fourth n-channel transistor is coupled to a gate of the sixth n-channel transistor, a drain of the fifth p-channel transistor, and a drain of the fourth n-channel transistor, wherein a gate of the sixth p-channel transistor is coupled to a gate of the seventh p-channel transistor and to a drain of the sixth p-channel transistor, wherein a gate of the fifth n-channel transistor is coupled to a drain of the eighth p-channel transistor, and wherein the voltage reference signal is coupled to a gate of the seventh n-channel transistor.

7. The circuit as recited in claim 6, wherein the fourth p-channel transistor is a same type of p-channel transistor used in bitcells of the memory array, and wherein the first, second, and third n-channel transistors are a same type of n-channel transistor used in bitcells of the memory array.

8. A method comprising:
generating a voltage that is proportional to a leakage current of a memory bitcell;
utilizing the voltage to bias a voltage regulator;
utilizing the voltage regulator to supply power to a memory array at a supply voltage which is proportional to the leakage current of bitcells of the memory array; and
tracking which threshold voltage is greater between a p-channel transistor threshold voltage and an n-channel transistor threshold voltage.

9. The method as recited in claim 8, further comprising biasing an n-channel transistor so that the n-channel transistor is in a sub-threshold region to track the leakage current of the memory bitcell as the leakage current varies over temperature.

10. The method as recited in claim 8, wherein the memory array comprises an SRAM array having SRAM memory bitcells.

11. The method as recited in claim 10, further comprising setting the supply voltage so that the supply voltage is proportional to whichever threshold voltage is greater between the p-channel transistor threshold voltage and the n-channel transistor threshold voltage.

12. The method as recited in claim 10, wherein a device type of an n-channel transistor is a same device type as n-channel transistors of the bitcells of the SRAM array, and wherein a device type of a p-channel transistor is a same device type as p-channel transistors of the bitcells of the SRAM array.

13. The method as recited in claim 10, further comprising mirroring the leakage current through a p-channel transistor and an n-channel transistor connected in series.

14. The method as recited in claim 13, further comprising tracking which threshold voltage is greater by:
connecting a gate of the p-channel transistor to a drain of the p-channel transistor; and
connecting a gate of the n-channel transistor to a source of the p-channel transistor.

15. A system comprising:
a circuit; and
a memory;
wherein the circuit is configured to:
generate a voltage that is proportional to leakage current of a memory bitcell;
utilize the voltage to bias a voltage regulator;
utilize the voltage regulator to supply power to the memory at a supply voltage which is proportional to the leakage current of bitcells of the memory; and
track which threshold voltage is greater between a p-channel transistor threshold voltage and an n-channel transistor threshold voltage.

16. The system as recited in claim 15, wherein the circuit is further configured to bias an n-channel transistor so that the n-channel transistor is in a sub-threshold region to track the leakage current of the memory bitcell as the leakage current varies over temperature.

17. The system as recited in claim 15, wherein the circuit is further configured to set the supply voltage so that the supply voltage is proportional to whichever threshold voltage is greater between the p-channel transistor threshold voltage and the n-channel transistor threshold voltage.

18. The system as recited in claim 17, wherein the circuit is further configured to mirror the leakage current through a p-channel transistor and an n-channel transistor connected in series.

19. The system as recited in claim 18, wherein the circuit is configured to track which threshold voltage is greater by:
connecting a gate of the p-channel transistor to a drain of the p-channel transistor; and
connecting a gate of the n-channel transistor to a source of the p-channel transistor.

\* \* \* \* \*